US006960481B2

(12) United States Patent
Yamaguchi

(10) Patent No.: US 6,960,481 B2
(45) Date of Patent: Nov. 1, 2005

(54) EVALUATION METHOD

(75) Inventor: Atsumi Yamaguchi, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 366 days.

(21) Appl. No.: 10/260,277

(22) Filed: Oct. 1, 2002

(65) Prior Publication Data

US 2003/0129509 A1 Jul. 10, 2003

(30) Foreign Application Priority Data

Jan. 7, 2002 (JP) .................................... P2002-000415

(51) Int. Cl.[7] ............................................. H01L 21/66
(52) U.S. Cl. ....................................................... 438/16
(58) Field of Search ........................ 438/8–18; 430/30; 700/121

(56) References Cited

U.S. PATENT DOCUMENTS 5,805,290 A    9/1998   Ausschnitt et al.
6,174,741 B1 * 1/2001  Hansch et al. ................. 438/14

FOREIGN PATENT DOCUMENTS

JP    7-74074    3/1995
KR    172801     3/1998

OTHER PUBLICATIONS

D. Wheeler, et al, "Phase Shift Focus Monitor Applications to Lithography Tool Control", 1997, SPIE, vol. 3051, pp. 225–233.

* cited by examiner

Primary Examiner—David A. Zarneke
Assistant Examiner—Monica D. Harrison
(74) Attorney, Agent, or Firm—Oblon, Spivak, McClelland, Maier & Neustadt, P.C.

(57) ABSTRACT

A high-reliability evaluation technique is proposed which is related to semiconductor device manufacture. A photoresist formed on a wafer is subjected to exposure and development thereby to form a pair of opposed patterns (1, 2) with distance x in the photoresist, followed by measurement of distance x between the patterns (1, 2) in the photoresist. For example, the amount of variations in exposure energy is evaluated by using the measuring result. The evaluation is made by using distance x between patterns (1, 2) which are easy to change with variations in exposure energy, etc., thus improving the reliability of evaluation.

16 Claims, 24 Drawing Sheets

F I G. 3
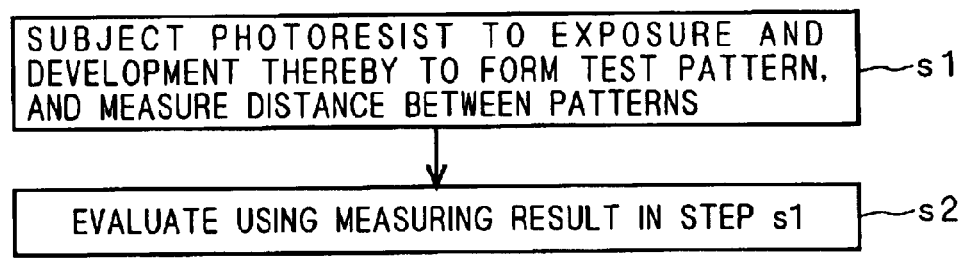

FIG. 4A
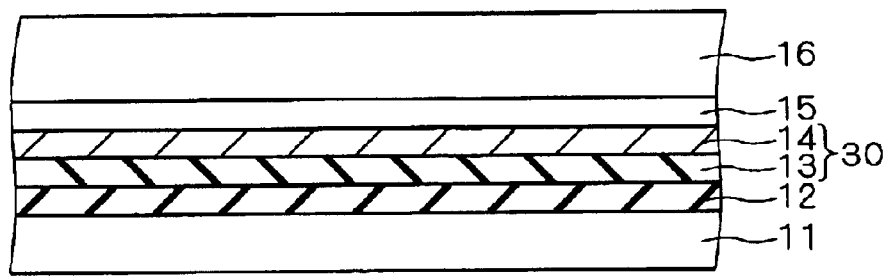
FIG. 4B
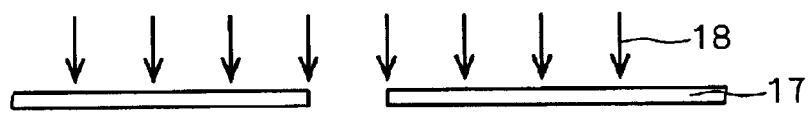
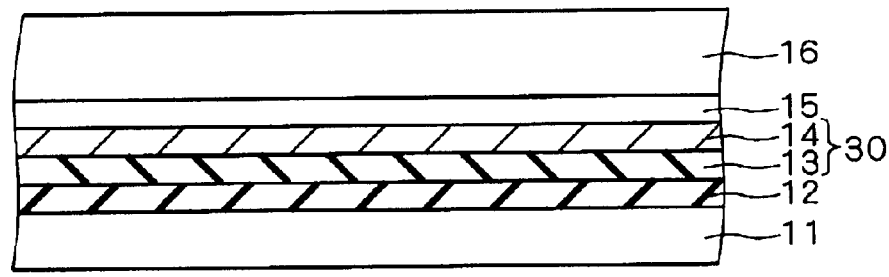
FIG. 4C
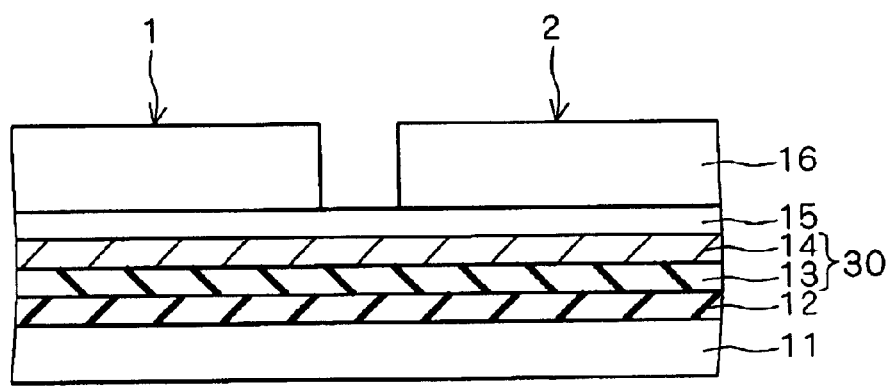

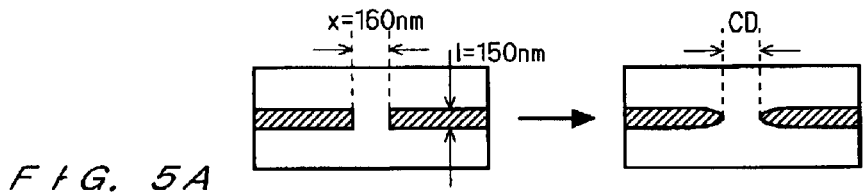
F I G. 5A
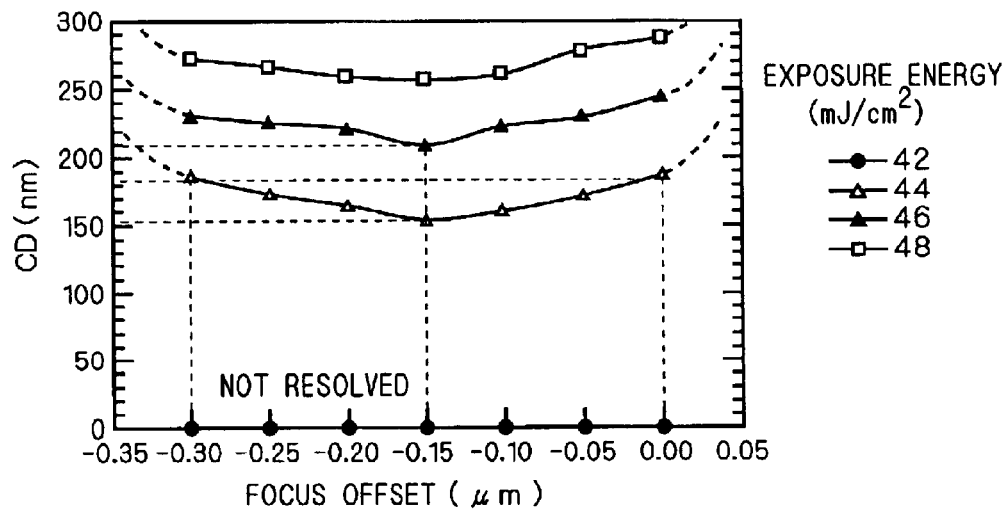
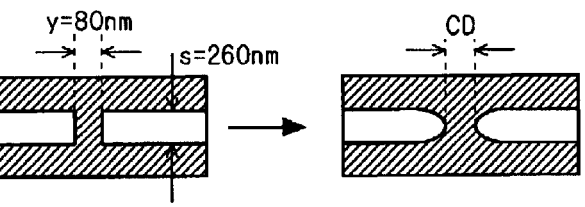
F I G. 5B
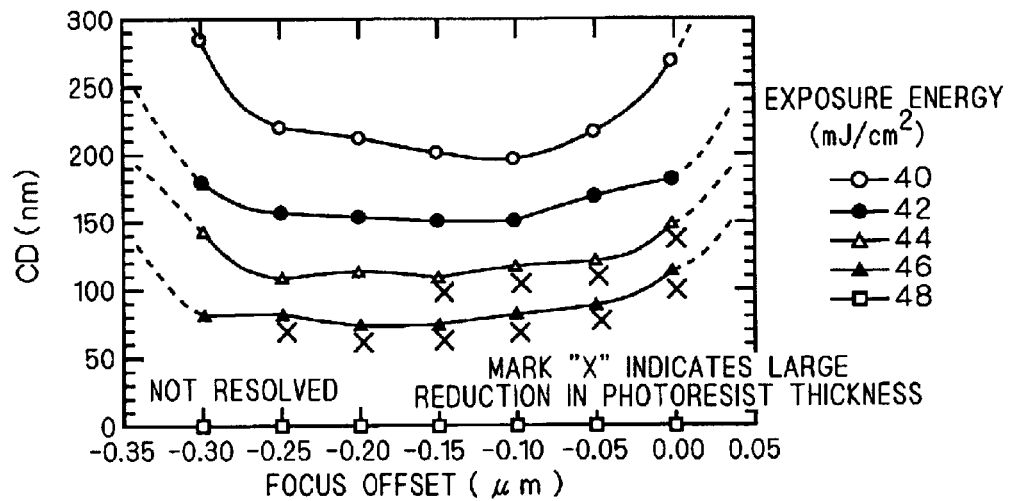

F I G. 7
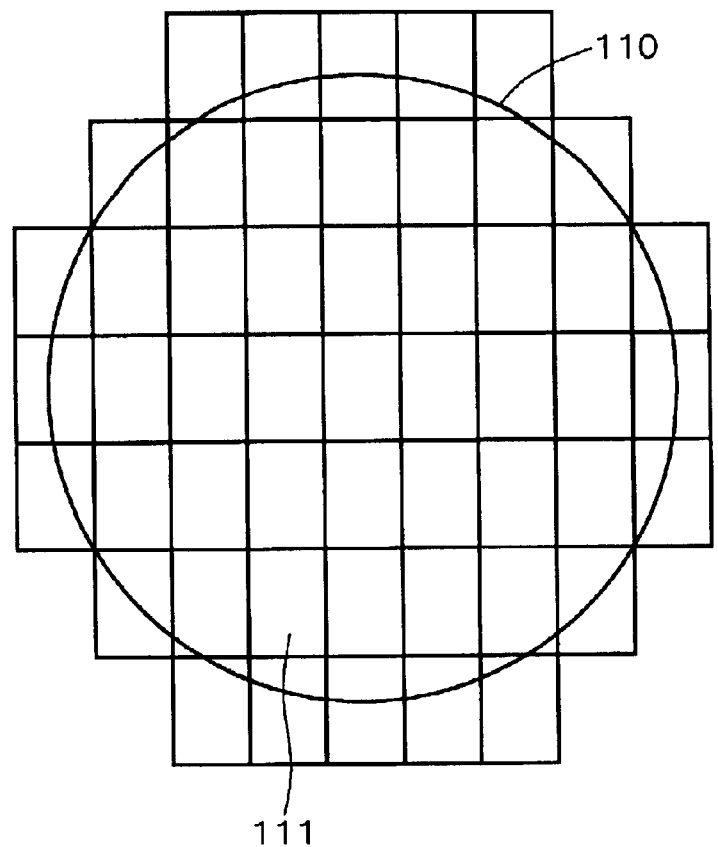
F I G. 8
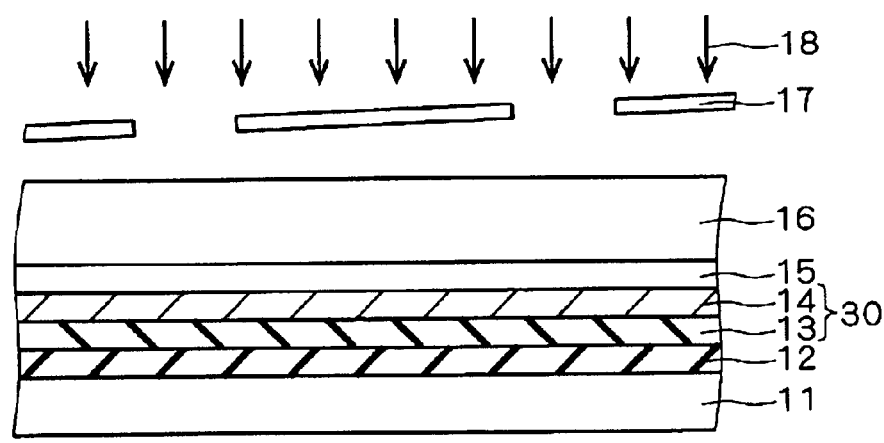

| Foc.\Exp. | -0.3 | -0.25 | -0.2 | -0.15 | -0.1 | -0.05 | 0 |
|---|---|---|---|---|---|---|---|
| 40 | 0.175-0.055 | 0.175-0.06 | 0.175-0.065 | | 0.175-0.07 | | |
| 42 | 0.165-0.065 | 0.165-0.07 | 0.165-0.075 | | | 0.165-0.08 | |
| 44 | 0.155-0.07 | 0.155-0.075 | 0.155-0.08 | | 0.155-0.085 | | |
| 46 | 0.145-0.085 | 0.145-0.095 | | 0.135-0.10 | | 0.145-0.095 | |
| 48 | 0.14-0.09 | 0.14-0.095 | | | | 0.14-0.10 | |

F I G. 18
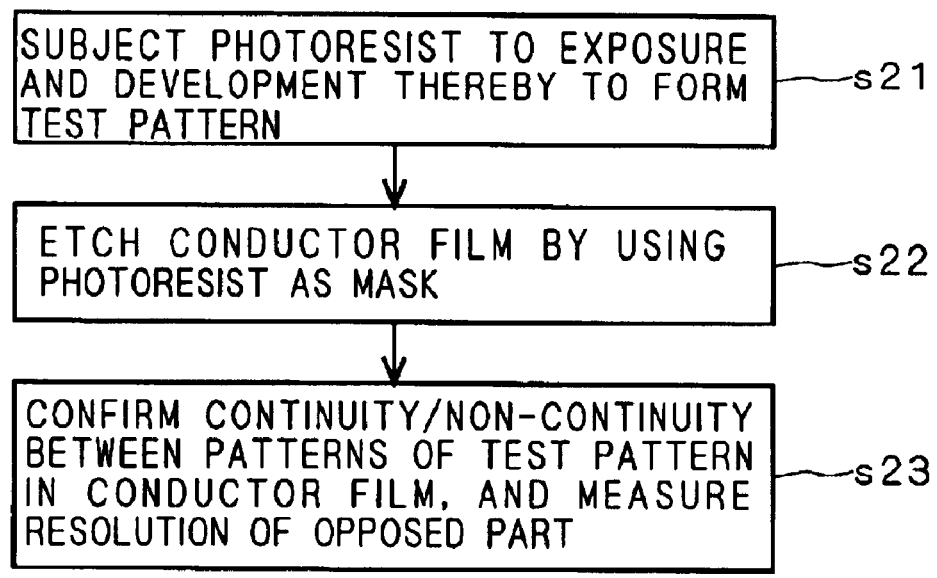

FIG. 19A
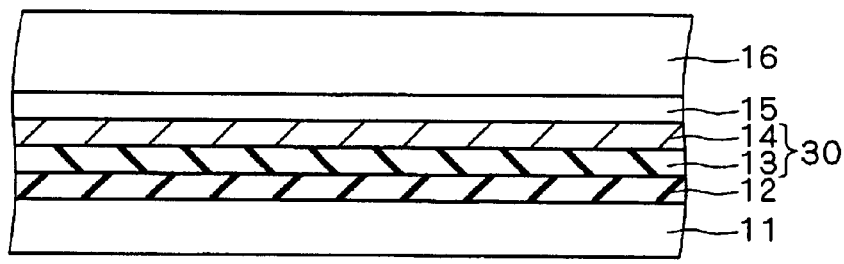
FIG. 19B
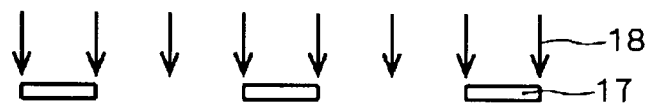
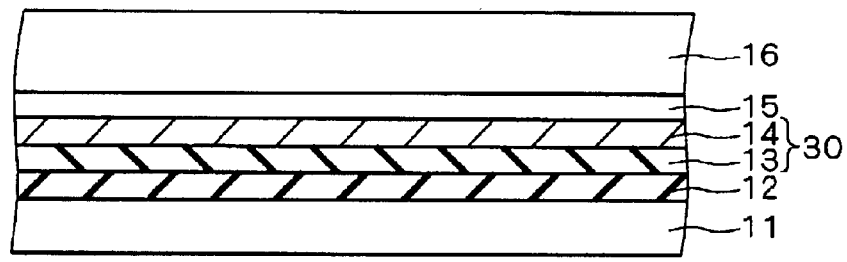
FIG. 19C
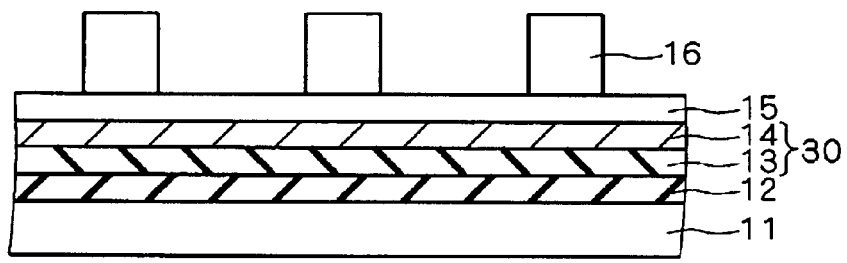
FIG. 19D
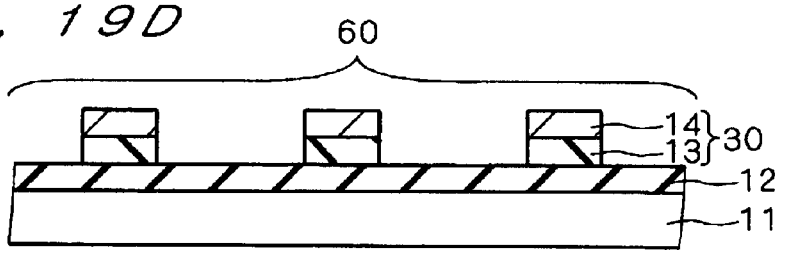

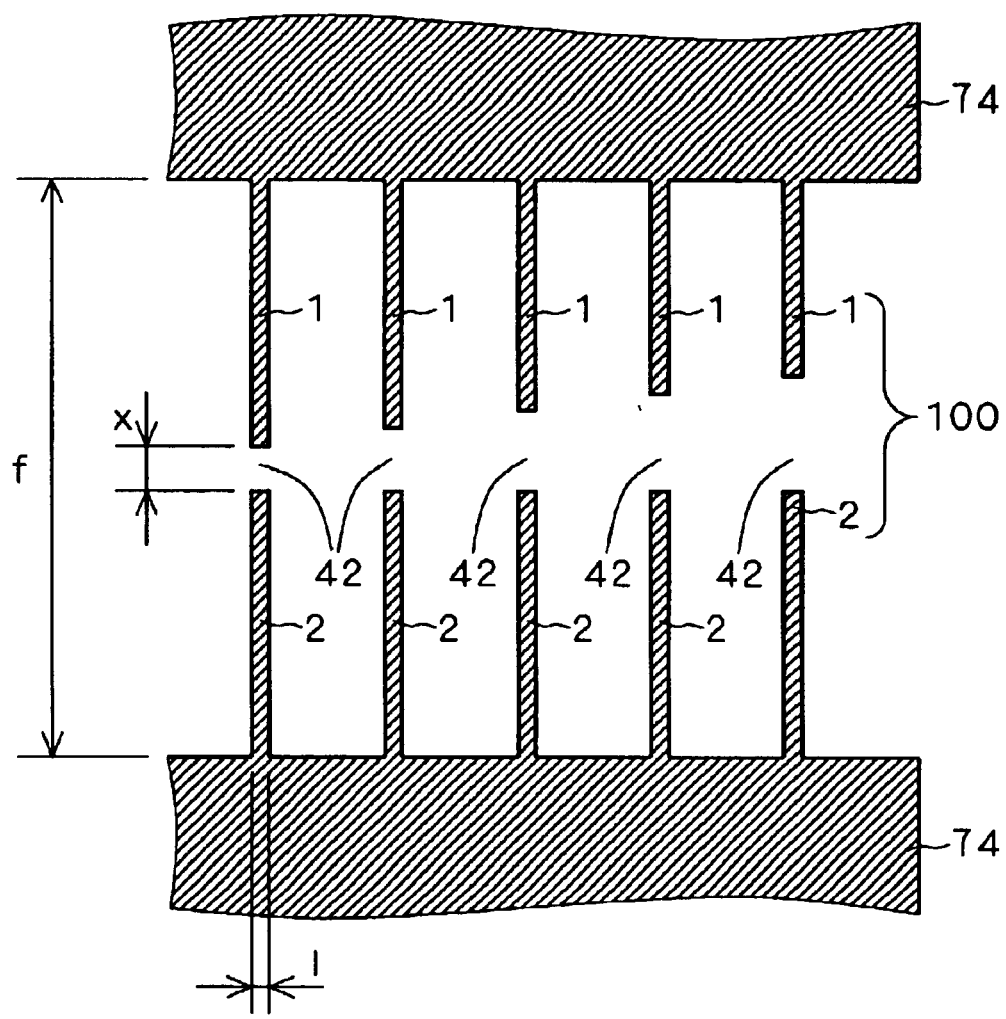
F I G. 21

F I G. 30
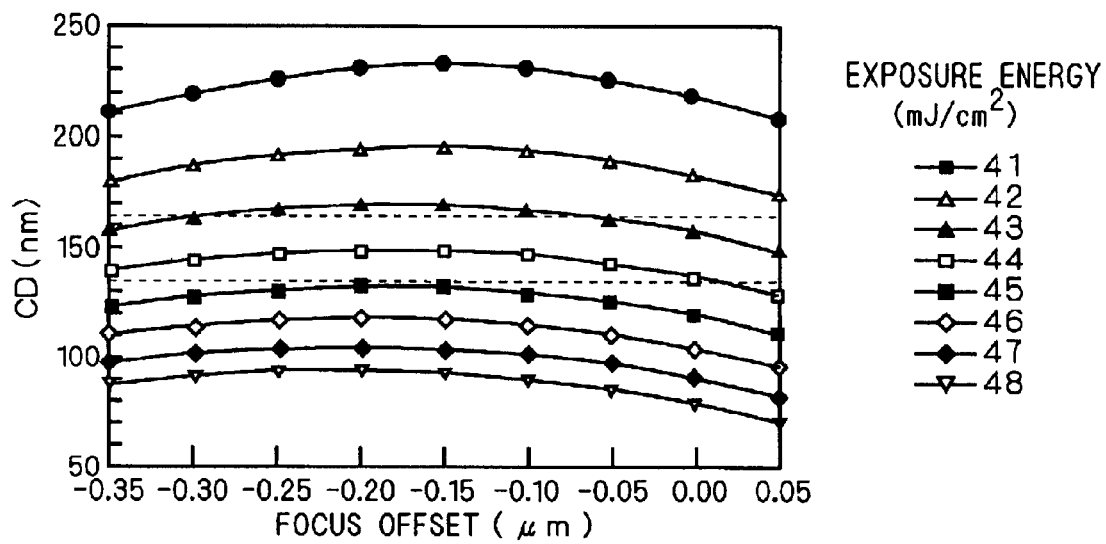
F I G. 31
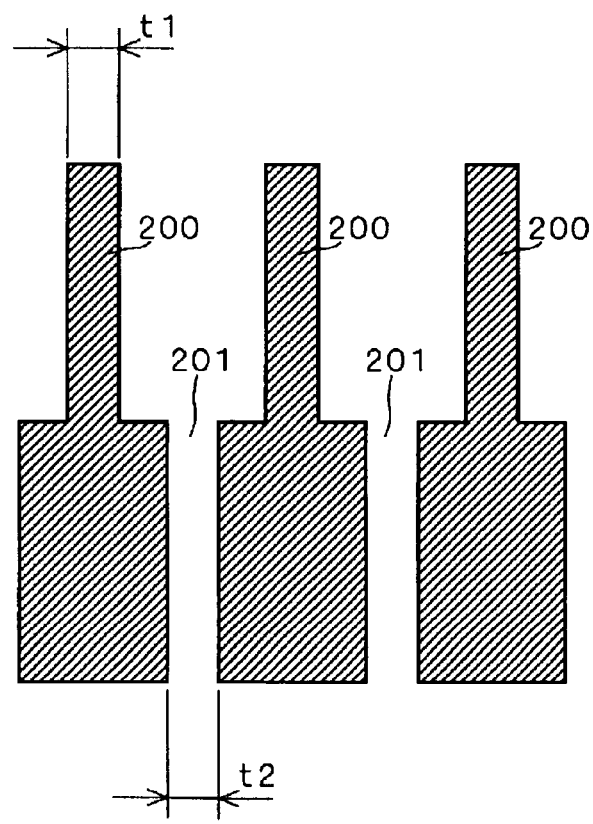

EVALUATION METHOD

BACKGROUND OF THE INVENTION

1. Field of the Invention

The present invention relates to an evaluation technique related to semiconductor device manufacture.

2. Description of the Background Art

In current semiconductor device manufacture, an underlying layer such as wafer (also called "semiconductor substrate"), etc. is subjected to selective processing by performing etching or ion implantation. In this instance, for the purpose of protecting the underlying layer, a photoresist is formed which is a composition photosensitive to active light such as ultraviolet, X-ray, and electron beam. The photoresist is then patterned according to the shape of portions of the underlying layer to be processed, thereby forming a resist pattern.

In the resist pattern forming method in general use, ultraviolet irradiation is performed by a reduction-projection aligner that is called "stepper" and uses, as light source, g-line of mercury lamp (436 nm in wavelength), i-line of mercury lamp (365 nm in wavelength), KrF excimer laser (248 nm in wavelength), or ArF excimer laser (193 nm in wavelength). Specifically, a photoresist formed on a wafer is subjected to exposure by using, as photomask, one that is called "reticle" and obtained by forming a circuit pattern with a shielding film such as of chromium (Cr), on a glass substrate. The circuit pattern drawn on the photomask is transferred to the photoresist on reduced scale. The photoresist is then subjected to development, thereby forming a predetermined pattern in the photoresist. For reference, in the manufacturing steps of semiconductor devices, the step of forming a resist pattern is usually performed about 20 to 30 times.

On the other hand, high integration and high performance of semiconductor devices have been further advanced recently. This trend is to call for further scale-down of resist patterns. For example, in DRAMs (dynamic random access memory) of 64 megabits to 256 megabits that are currently in quantity production, a resist pattern having a line width of 150–200 nm is drawn. In its photolithography step, KrF excimer laser is most frequently used. Further scale-down of resist pattern demands improvements in dimensional accuracy of resist pattern and alignment accuracy between photomask and wafer.

Main factors that affect the dimensional accuracy of resist pattern are exposure energy variations and focus offset variations. FIG. 30 shows the result that is obtained by simulating dimensional variations of resist pattern with respect to variations in exposure energy and focus offset. That is, there is shown dimensional variations in a resist pattern when an isolated line pattern having a line width of 150 nm is formed in a photoresist. Specifically, FIG. 30 shows the simulation results when a resist pattern is formed by exposure of KrF excimer laser with 2/3 annular illumination apertures, at 0.65 in lens numerical aperture NA. In FIG. 30, the horizontal axis represents focus offset, which is a focus distance from a predetermined reference plane in an aligner. Positive values indicate that the focus is located at a lower position (a deep position) of the photoresist than the reference plane. Alphabets "CD" of the vertical axis in FIG. 30 indicates line width of resist pattern obtained by simulation.

Referring to FIG. 30, the line width of resist pattern most closely approaches 150 nm when exposure energy is 44 mJ/cm$^2$ and focus offset is −0.15 μm. Variations in exposure energy and focus offset cause variations in the line width of resist pattern. The formation of high-performance transistor usually requires that dimensional control be within ±10% to design value. For example, if the design value of line width of resist pattern is 150 nm, dimensional accuracy of ±15 nm is necessary. In FIG. 30, two broken lines indicate the range of ±15 nm to a line width of 150 nm. That is, the lower broken line indicates a line width of 135 nm, and the upper broken line indicates a line width of 165 nm. From FIG. 30, exposure tolerance EL and focus tolerance DOF are obtained as follows: EL=3.8% and DOF=0.35 μm. The value "3.8%" is a value obtained by standardizing the range of exposure energy variations that falls in the range of 150 nm±10%, by exposure energy of 44 mJ/cm$^2$. The value "0.35 μm" is a range of variations in focus offset when the line width of resist pattern falls in the range of 150 nm±10%, at an exposure energy of 44 mJ/cm$^2$.

As stated above, as the scale-down of resist pattern proceeds, exposure tolerance EL and focus tolerance DOF when forming the resist pattern are extremely narrow. In order to stably form a resist pattern under such a narrow process tolerance, it is necessary to evaluate the age-based amounts of variations in focus offset and exposure energy. Specifically, in the manufacturing steps of semiconductor device, focus offset or exposure energy may vary between different manufacturing lots. Therefore, it is desirable that the amount of variation be found and evaluated and then exposure conditions be corrected as required. Not only the amount of variations in exposure energy and focus offset but also coat uniformity of photoresist and sensitivity stability of photoresist, etc. affect focus tolerance DOF and exposure tolerance EL. It is therefore necessary to evaluate each of these items.

As a method of evaluating the age-based amount of variations in focus offset and exposure energy, there has conventionally been proposed a method including the steps of measuring a line width of a line pattern or space pattern formed in a photoresist to obtain a measuring result; and evaluating their respective amount of variations. FIG. 31 shows a test pattern used in a conventional evaluation method. This conventional test pattern has an isolated line pattern 200 having a line width of t1, and an isolated space pattern 201 having a line width of t2. For instance, this test pattern is formed in a photoresist every time the manufacturing lot of a semiconductor device changes, and the line width t1 of the line pattern 200 and line width t2 of the space pattern 201 are measured. As described above, the variations in exposure energy and focus offset causes variations in the line width of resist pattern. Accordingly, when exposure energy and focus offset are varied between manufacturing lots, line widths t1 and t2 are also varied. Therefore, the age-based amount of variations in exposure energy and focus offset can be evaluated by measuring line widths t1 and t2. This makes possible to correct the manufacturing conditions of a semiconductor device based on the results so evaluated. Further, the semiconductor device can be manufactured under the corrected manufacturing conditions.

However, sufficient reliability cannot be obtained with the evaluation method using the measuring results of the line widths of line pattern and space pattern formed in a photoresist.

SUMMARY OF THE INVENTION

It is an object of the present invention to propose a high-reliability evaluation technique related to semiconductor device manufacture.

An evaluation method according to a first aspect of the present invention includes the steps (a) and (b).

The step (a) is the step of subjecting a photoresist formed on a wafer to exposure and development thereby to form in the photoresist a test pattern having at least one paired line patterns, each of the line patterns extending in one direction and an end portion of each of the line patterns in the direction of the length being opposed to each other, and measuring distance between the line patterns formed in the photoresist.

The step (b) is the step of evaluating a predetermined item related to semiconductor device manufacture by using measuring results obtained by performing the step (a).

Because the evaluation is performed by measuring the distance between a pair of patterns which is easy to change, the reliability of evaluation can be improved than the case that evaluation is performed by measuring the line width of patterns.

An evaluation method according to a second aspect of the present invention includes the steps (a) and (b).

The step (a) is the step of subjecting a photoresist formed on a wafer to exposure and development thereby to form in the photoresist a test pattern having at least one paired space patterns, each of the space patterns extending in one direction and an end portion of each of the space patterns in the direction of the length being opposed to each other, and measuring distance between the space patterns formed in the photoresist.

The step (b) is the step of evaluating a predetermined item related to semiconductor device manufacture by using measuring results obtained by performing the step (a).

Because the evaluation is performed by measuring the distance between a pair of patterns which is easy to change, the reliability of evaluation can be improved.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a flowchart showing the evaluation method of the first preferred embodiment;

FIGS. 4A, 4B and 4C are sectional views showing a method of forming a test pattern in the first preferred embodiment;

FIG. 5 is a diagram showing circumstances of variations in distance between patterns in the test pattern of the first preferred embodiment;

FIG. 7 is a diagram showing an exposure map in the evaluation method of the first preferred embodiment;

FIG. 8 is a sectional view showing circumstances where a photomask and wafer are not maintained in parallel to each other;

FIG. 17 is a diagram showing circumstances of variations in resolution at opposed part in the test pattern of the second preferred embodiment;

FIG. 18 is a flowchart showing the evaluation method of the second preferred embodiment;

FIG. 19 is a sectional view showing a method of forming a test pattern in the second preferred embodiment;

FIGS. 20 and 21 are diagrams showing other test pattern used in the evaluation method of the second preferred embodiment;

FIG. 30 is a diagram showing circumstances of variations in the line width of line pattern; and FIG. 31 is a diagram showing a line pattern and space pattern used in a conventional evaluation method.

DESCRIPTION OF THE PREFERRED EMBODIMENTS

First Preferred Embodiment

Figure 1:
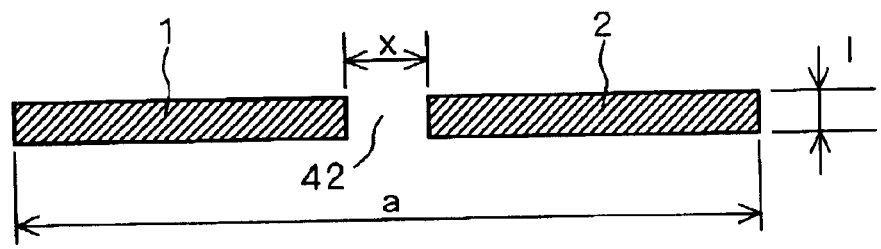
FIG. 1 is a diagram showing a test pattern used in an evaluation method according to a first preferred embodiment of the invention.
Figure 2:
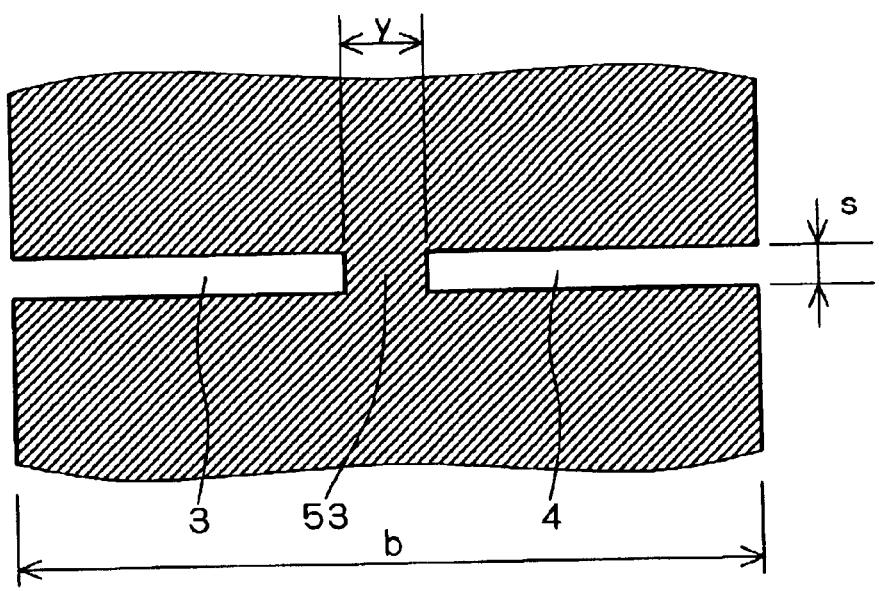
FIG. 2 is a diagram showing other test pattern used in an evaluation method of the first preferred embodiment.

FIGS. 1 and 2 are diagrams showing test patterns 10a and 10b used in an evaluation method according to a first preferred embodiment, respectively. FIG. 3 is a flowchart showing the evaluation method of this embodiment. As shown in FIG. 1, the test pattern 10a has a pair of patterns 1 and 2 that are isolated line patterns and are opposed to each other in distance x. Specifically, each of the patterns 1 and 2 extends in one direction, and one end portion of the pattern 1 in the direction of the length and one end portion of the pattern 2 in the direction of the length are opposed to each other in distance x, and the patterns 1 and 2 are disposed approximately linearly. The test pattern 10a has an opposed part 42 defined between the patterns 1 and 2. That is, the opposed part 42 is an area sandwiched between one end of pattern 1 in the direction of the length and one end of pattern 2 in the direction of the length. For example, in the patterns 1 and 2, line width l is 150 nm and distance x is 160 nm. Distance a from the other end of pattern 1 in the direction of the length to the other end of pattern 2 in the direction of the length is 100 µm, for example.

Referring to FIG. 2, the test pattern 10b has a pair of patterns 3 and 4 that are isolated space patterns and are opposed to each other in distance y. Specifically, each of the patterns 3 and 4 extends in one direction, and one end portion of the pattern 3 in the direction of the length and one end portion of the pattern 4 in the direction of the length are opposed to each other in distance y, and the patterns 3 and 4 are disposed approximately linearly. The test pattern 10b has an opposed part 53 defined between the patterns 3 and 4. That is, the opposed part 53 is an area sandwiched between one end of pattern 3 in the direction of the length and one end of pattern 4 in the direction of the length. For example, in the patterns 3 and 4, line width s is 260 nm and distance y is 80 nm. Distance b from the other end of pattern 3 in the direction of the length to the other end of pattern 4 in the direction of the length is 100 μm, for example. In the following description, each of the test patterns 10a and 10b is referred to as a "test pattern 10," when there is no need to differentiate between the test patterns 10a and 10b.

In the evaluation method of the first preferred embodiment shown in FIG. 3, evaluations related to semiconductor device manufacture are performed by using the above-mentioned test patterns 10a and 10b. Following is an evaluation method using the test pattern 10a in the first preferred embodiment. Referring to FIG. 3, in step s1, a photoresist formed on a wafer is subjected to exposure and development, so that a test pattern 10a having a pair of opposed patterns 1 and 2 is formed in the photoresist. Distance x between the patterns 1 and 2 in the photoresist is measured. In step s2, a predetermined item is evaluated by using the measuring result obtained by performing step s1, that is, using distance x between the patterns 1 and 2. An evaluation method using the test pattern 10b is performed in the same manner as follows. In step s1, a photoresist formed on a wafer is subjected to exposure and development, so that a test pattern 10b having a pair of opposed patterns 3 and 4 is formed in the photoresist. Distance y between the patterns 3 and 4 in the photoresist is measured. In step s2, a predetermined item related to semiconductor device manufacture is evaluated by using the measuring result obtained by performing step s1, that is, using distance y between the patterns 3 and 4. Steps s1 and s2 will be described in detail hereinafter by item to be evaluated in step s2. Step s1 may be performed plural times, depending on the evaluation item in step s2.

A method of forming the test pattern 10a on a photoresist will next be described in detail. FIGS. 4A, 4B and 4C are sectional views showing the steps of forming the test pattern 10a on a photoresist 16. Referring to FIG. 4A, a silicon oxide film 12 in thickness of 10 nm, a titanium nitride film 13 in thickness of 80 nm, and a tungsten film 14 in thickness of 100 nm are deposited on a wafer 11 in this order named. An organic anti-reflection film 15 is deposited in thickness of 80 nm on the tungsten film 14, and a photoresist 16 for KrF excimer laser is formed on the organic anti-reflection film 15, followed by pre-bake at 100° C. for 60 seconds. At this time, the number of revolutions during coating is adjusted such that the photoresist 16 has a film thickness of 445 nm. The titanium nitride film 13 and tungsten film 14A form a conductor film 30.

Referring to FIG. 4B, the photoresist 16 is subjected to exposure by using a photomask 17 on which a predetermined mask pattern is formed, and a stepper of which light source is KrF excimer laser 18. The exposure is carried out by off-axis method using 2/3 annular illumination apertures in which the number of apertures of lens NA is set to 0.65. The mask pattern formed in the photomask 17 is a mask pattern for forming the above-mentioned test pattern 10a in the photoresist 16. Specifically, when using a stepper of which reduction ratio is 1/5, a pattern having a five-time dimension of the above-mentioned test pattern 10a (160 nm in distance x, 150 nm in line width l, and 100 μm in distance a) is drawn on the photomask 17, as a mask pattern.

Referring to FIG. 4C, a bake is performed at 110° C. for 60 seconds, and development using tetramethyl ammonium hydroxide (TMAH) is performed for 60 seconds. As the result, a test pattern 10a having the patterns 1 and 2 is formed in the photoresist 16. The test pattern 10b can be formed in the same manner.

Referring now to FIGS. 5A and 5B, description will be given of variations in distance x between the patterns 1 and 2, or distance y between the patterns 3 and 4, which are formed in the photoresist, when exposure energy and focus offset are changed. FIG. 5A shows the variations in distance x between the patterns 1 and 2 in the photoresist when exposure energy and focus offset are changed. FIG. 5B shows the variations in distance y between the patterns 3 and 4 in the photoresist when exposure energy and focus offset are changed. It should be noted that the values indicated in FIGS. 5A and 5B are simulation results. Alphabets "CD" of the vertical axis in FIG. 5A indicates distance x between the patterns 1 and 2 in the test pattern 10a that is formed in the photoresist by the method shown in FIGS. 4A to 4C. Alphabets "CD" of the vertical axis in FIG. 5B indicates distance y between the patterns 3 and 4 in the test pattern 10b that is formed in the photoresist by the method shown in FIGS. 4A to 4C.

As shown in FIG. 5A, distance x between the patterns 1 and 2 formed in the photoresist most closely approaches 160 nm at an exposure energy of 44 mJ/cm$^2$ and a focus offset of −0.15 μm. Distance x between the patterns 1 and 2 increases as exposure energy increases, whereas distance x decreases as exposure energy decreases. When exposure energy is 42 mJ/cm$^2$, the patterns 1 and 2 are brought into contact, thus failing to resolve the opposed part 42 defined between the patterns 1 and 2. As focus offset has a larger or smaller value than −0.15 μm, distance x between the patterns 1 and 2 increases.

On the other hand, as shown in FIG. 5B, distance y between the patterns 3 and 4 formed in the photoresist most closely approaches 80 nm at an exposure energy of 46 mJ/cm$^2$ and a focus offset of −0.15 μm. Distance y between the patterns 3 and 4 decreases as exposure energy increases, whereas distance y increases as exposure energy decreases. When exposure energy is 48 mJ/cm$^2$, the patterns 3 and 4 are brought into contact, thus failing to resolve the opposed part 53 defined between the patterns 3 and 4. As focus offset has a larger or smaller value than −0.15 μm, distance y between the patterns 3 and 4 increases. In the case of forming the test pattern 10b in the photoresist as shown in FIG. 5B, there is a tendency that the thickness of photoresist is more reduced as focus offset is increased. In the following description, exposure energy and focus offset having a value with which distance x between the patterns 1 and 2 formed in the photoresist, or distance y between the patterns 3 and 4 formed in the photoresist, closely approaches their respective set values (i.e., 160 nm, and 80 nm), are referred to as "best exposure energy" and "best focus offset," respectively.

As discussed above, when forming the patterns 1 and 2 that are line patterns, or the patterns 3 and 4 that are space patterns, distance x between the formed patterns 1 and 2, and distance y between the formed patterns 3 and 4, vary depending on the variations in exposure energy and focus offset. On the assumption that distances x and y exhibit such behavior, steps s1 and s2 will be described in detail by item to be evaluated in step s2.

Following is an evaluation method of the first preferred embodiment when evaluating the age-based amount of variations in exposure energy and focus offset. As previously described, when manufacturing a semiconductor device, exposure energy and focus offset may vary between manufacturing lots, for example. It is therefore necessary to evaluate the amount of these variations. Here, a certain manufacturing lot will be hereinafter called "manufacturing lot 1." The above-mentioned step s1 is performed before manufacturing semiconductor devices of the manufacturing lot 1. The next succeeding manufacturing lot will be hereinafter called "manufacturing lot 2." Step s1 is performed again before manufacturing semiconductor devices of the manufacturing lot 2. The measuring results obtained by performing the step s1 twice are used to evaluate the amount of variations in exposure energy and focus offset.

Specifically, when evaluating the age-based amount of variations in exposure energy and focus offset by using the test pattern 10a, data as shown in FIG. 5 is previously taken before performing the evaluation method of the first preferred embodiment. That is, the value of distance x between the patterns 1 and 2 in the test pattern 10a formed in the photoresist when exposure energy and focus offset are changed, is actually measured by SEM (scanning electron microscope) observation, for example. The test pattern 10a used here is formed in a photoresist by the method shown in FIGS. 4A to 4C, for example. In the first preferred embodiment, the measured value of distance x between the patterns 1 and 2 formed in the photoresist, which is obtained when exposure energy and focus offset are changed, is to be the same as that indicated in FIG. 5A.

After taking the above-mentioned data, the evaluation method of the first preferred embodiment is performed. In this embodiment, before manufacturing semiconductor devices of the manufacturing lot 1, step s1 is performed under the exposure conditions and development conditions for manufacturing the semiconductor devices. Specifically, a photoresist formed on a wafer in such a stacked structure as shown in FIG. 4A, is subjected to exposure and development under the exposure conditions and development conditions for manufacturing the semiconductor devices, so that the test pattern 10a having a pair of opposed patterns 1 and 2 is formed in the photoresist. Then, the distance x between the patterns 1 and 2 formed in the photoresist is measured by SEM observation, for example. In the following, the measured distance x is called "distance x1." From FIG. 5A, for example, distance x1 is set to 155 nm because it is usually necessary to evaluate the amount of variations from the best exposure energy and best focus offset. Thereafter, the semiconductor devices of manufacturing lot 1 are manufactured.

Step s1 is performed again between the completion of manufacture of semiconductor devices of the manufacturing lot 1 and the start of manufacture of semiconductor devices of the next following manufacturing lot 2. Specifically, a photoresist formed on a wafer in such a stacked structure, as shown in FIG. 4A, is subjected to exposure and development under the exposure conditions and development conditions for manufacturing the semiconductor devices, so that the test pattern 10a having a pair of opposed patterns 1 and 2 is formed in the photoresist. Distance x between the patterns 1 and 2 formed in the photoresist is measured. In the following, the measured distance x is called "distance x2." For example, distance x2 is 210 nm. Then, step s2 is performed. Specifically, the age-based amount of variations in exposure energy and focus offset are evaluated by using the value of distance x1 (155 nm), which is the measuring result obtained by performing the first step s1, as well as the value of distance x2 (210 nm), which is the measuring result obtained by performing the second step s1. More specifically, if the main factor affecting the difference between manufacturing lots in terms of distance x between the patterns 1 and 2 formed in the photoresist, is only variations in exposure energy, the amount of variations in exposure energy can be obtained from distances x1 and x2, by using the data shown in FIG. 5A which is taken in advance. Accordingly, the amount of variations in exposure energy is obtained from distances x1 and x2, and the obtained amount of variations is evaluated.

Following is a method with which the amount of variations in exposure energy is found from distance x1 and distance x2 by using the data shown in FIG. 5A. Distances x1 and x2 are 155 nm and 210 nm, respectively. Accordingly, from FIG. 5A, the exposure energy corresponding to 155 nm is 44 mJ/cm$^2$, and the exposure energy corresponding to 210 nm is 46 mJ/cm$^2$. From the two values, the amount of variations in exposure energy is +2 mJ/cm$^2$. This amount of variation is called "the amount of variation 1." Then, the amount of variation 1 is evaluated. Specifically, the amount of variation 1 between manufacturing lots thus obtained is compared with the amount of variation in exposure energy that is tolerated in semiconductor device manufacture (which is hereinafter referred to as "the amount of variation 2"). As the result of evaluation, that is, as the result of comparison, when the amount of variation 1 is less than the amount of variation 2, the manufacture of manufacturing lot 2 is performed. When the amount of variation 1 is larger than the amount of variation 2, exposure energy is corrected before starting the manufacture of manufacturing lot 2.

On the other hand, if the main factor affecting the difference between manufacturing lots in terms of distance x between the patterns 1 and 2 formed in the photoresist, is only variations in focus offset, the variations in focus offset can be obtained from distances x1 and x2, by using the data shown in FIG. 5A which is taken in, advance. Thus, in step s2, the amount of variations in focus offset is obtained from distances x1 and x2, and the obtained amount of variations is evaluated. Following is a method with which the amount of variations in focus offset is found from distance x1 and distance x2, by using the data shown in FIG. 5A. For convenience in illustration, let distance x1 and distance x2 be 155 nm and 185 nm, respectively. Since distances x1 is 155 nm, it is found from FIG. 5A that the focus offset corresponding to 155 nm is −0.15 $\mu$m. Since distances x2 is 185 nm, it is found from FIG. 5A that the focus offset corresponding to 185 nm is −0.30 $\mu$m, and 0.00 $\mu$m. From these values, the absolute value of the amount of variations is 0.15 $\mu$m. This value is then evaluated. For example, the absolute value of the amount of variation between manufacturing lots thus obtained, 0.15 $\mu$m, is compared with the amount of variation in focus offset that is tolerated in semiconductor device manufacture (which is hereinafter referred to as "the amount of variation 10"). As the result of evaluation, that is, as the result of comparison, when 0.15 $\mu$m is less than the amount of variation 10, the manufacture of manufacturing lot 2 is performed. When 0.15 $\mu$m is larger than the amount of variation 10, exposure conditions are corrected and focus offset is corrected before starting the manufacture of manufacturing lot 2.

Likewise, when evaluating the age-based amount of variations in exposure energy and focus offset by using the test pattern 10b, data as shown in FIG. 5B is previously taken before performing the evaluation method of the first preferred embodiment. Then, as described above, step s1 and step s2 are performed to evaluate the amount of variations in exposure energy or focus offset. It should be noted that when using the test pattern 10b having the patterns 3 and 4 that are space patterns, the amount of variations in focus offset can be obtained more accurately than would be the case with the test pattern 10a. Specifically, as shown in FIG. 5B, there is a tendency that photoresist is subjected to more reduction of thickness as focus offset is increased. Therefore, by measuring distance y between the patterns 3 and 4 formed in the photoresist and observing such a reduction in thickness, it can be found that focus offset varies toward the plus or minus side.

In the instance that either of exposure energy and focus offset varies, and, it is not evident that variations is originated from exposure energy or focus offset, it is possible to determine whether exposure energy or focus offset varies by performing the evaluation method of the first preferred embodiment taking the test patterns 10a and 10b as a test pattern. This enables to reliably evaluate the desired evaluation item. As shown in FIGS. 5A and 5B, when focus offset varies, the variations in distance x and distance y exhibit the same characteristics. On the other hand, when exposure energy varies, the variations in distance x and distance y exhibit the reverse characteristics. That is, distance x increases as exposure energy increases, whereas distance y decreases as exposure energy increases. By utilizing these characteristics, it is determinable whether either of exposure energy and focus offset varies. First, data as shown in FIGS. 5A and 5B are taken before performing the evaluation method of the first preferred embodiment. Before manufacturing the manufacturing lot 1, step s1 is performed. That is, the test patterns 10a and 10b are formed in a photoresist, followed by measurement of distance x between the patterns 1 and 2, and distance y between the patterns 3 and 4, which are formed in the photoresist. Then, step s1 is performed again before manufacturing the manufacturing lot 2. If exposure energy varies during the second step s1, the polarity of variation in the distance x obtained in the second step s1 to the distance x obtained in the first step s1, is different from the polarity of variation in the distance y obtained in the second step s1 to the distance y obtained in the first step s1. Therefore, in step s2, it can be determined whether or not exposure energy varies. Referring to the graphs shown in FIGS. 5A and 5B, needless to say, if focus offset varies, the polarity of variation in the distance x obtained in the second step s1 to the distance x obtained in the first step s1 is identical with the polarity of variation in the distance y obtained in the second step s1 to the distance y obtained in the first step s1.

As described above, with the evaluation method according to the first preferred embodiment, the age-based amount of variations in exposure energy and focus offset can be evaluated by using the test patterns 10a and 10b. Although in the foregoing description, the evaluation method of the first preferred embodiment is performed between the completion of manufacture of a certain manufacturing lot and the start of manufacture of the next succeeding manufacturing lot, besides the manufacturing steps of semiconductor device, this evaluation method can be performed in the course of the manufacturing steps of semiconductor device by incorporating a mask pattern corresponding to the test pattern 10, into a photomask that is actually used in semiconductor device manufacture.

An evaluation method of the first preferred embodiment when evaluating the stability of photoresist sensitivity will next be described. Photoresist sensitivity may vary between manufacturing lots or with the passage of time. Therefore, it is necessary to evaluate the stability of photoresist sensitivity between manufacturing lots, or the age-based stability of photoresist sensitivity within the same manufacturing lot. For instance, step s1 is performed before and after the photoresist gallon bottle is exchanged, and the stability of photoresist sensitivity is evaluated based on the measuring results obtained by performing step s1. Since manufacturing lot is changed in units of several or several ten gallon bottles of photoresist, the stability of photoresist sensitivity between manufacturing lots, or the age-based stability of photoresist sensitivity within the same manufacturing lot can be evaluated by performing step s1 before and after the gallon bottle exchange as described above.

Following is a specific description of a method of evaluating the stability of photoresist sensitivity by using the test pattern 10a. A certain gallon bottle is hereinafter referred to as a "gallon bottle 1." Photoresist in the gallon bottle 1 is formed on a wafer in such a stacked structure as shown in FIG. 4A. Then, the photoresist formed on the wafer is subjected to exposure and development under a predetermined exposure conditions and development conditions, thereby forming, in the photoresist, a test pattern 10a having a pair of patterns 1 and 2 that are opposed to each other. Thereafter, distance x between the patterns 1 and 2 in the photoresist is measured by SEM observation, for example (i.e., execution of the first step s1).

After exchanging the gallon bottle, the photoresist of another gallon bottle is formed on a wafer in such a stacked structure as shown in FIG. 4A. The photoresist formed on the wafer is subjected to exposure and development under the same exposure and development conditions as in the first step s1, thereby forming a test pattern 10a in the photoresist. Thereafter, distance x between the patterns 1 and 2 in the photoresist is measured by SEM observation, for example (i.e., execution of the second step si).

Subsequently, the stability of photoresist sensitivity is evaluated by using the distance x obtained by performing the first step s1 (hereinafter referred to as "distance x10) and the distance x obtained in the second step s1 (hereinafter referred to as "distance x11). Specifically, if the main factor affecting the difference between distance x10 and distance x11 is the variations in photoresist sensitivity, the variations in photoresist sensitivity causes the same phenomenon as in the variations in exposure energy. That is, distance x11 is different from distance x10. Therefore, the stability of photoresist sensitivity can be evaluated by comparison of distance x10 with distance x11. It is of course capable of evaluating the stability of photoresist sensitivity between manufacturing lots, or the age-based stability of photoresist sensitivity, by using the test pattern 10b or both of the test patterns 10a and 10b.

An evaluation method of the first preferred embodiment when evaluating the coat uniformity of photoresist will next be described. The diameter of wafer is usually as much as 200 mm or 300 mm. When forming a photoresist on a wafer, a difference in level in the photoresist thickness may occur within the wafer. Therefore, it is necessary to evaluate the coat uniformity of photoresist. In step s1 of the evaluation method of the first preferred embodiment, for example, a plurality of test patterns 10 are formed in a photoresist over the entire surface of a wafer, followed by measurement of distance x between patterns 1 and 2, or distance y between patterns 3 and 4, in each test pattern 10 formed in the photoresist. In step s2, the coat uniformity of photoresist is evaluated by using the measuring result obtained by performing step s1.

Figure 6:
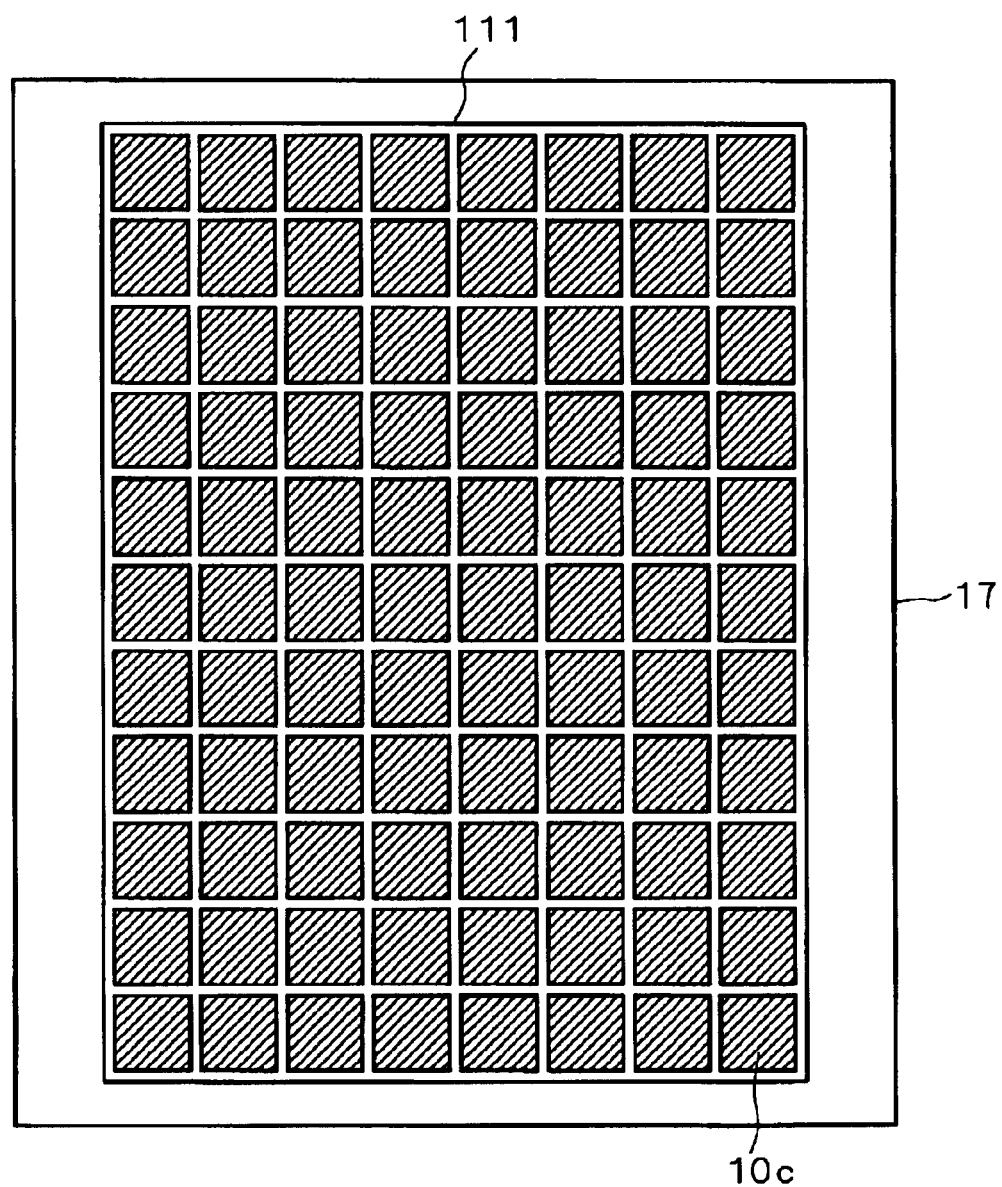
FIG. 6 is a plan view showing a photomask used in the evaluation method of the first preferred embodiment.

FIG. 6 shows a photomask 17 that is used in evaluating the coat uniformity of photoresist, in which a rectangular region 111 corresponds to a single chip of wafer. Referring to FIG. 6, a plurality of mask patterns 10c for forming test patterns 10 on a photoresist are formed over approximately the entire surface of the photomask 17. In step s1, using the photomask 17 shown in FIG. 6, the photoresist is subjected to exposure with the use of an exposure map shown in FIG. 7, followed by development, thereby forming the test patterns 10 in the photoresist over the entire surface of the wafer. In FIG. 7, a circle 110 indicates the outline of the wafer. Further in step s1, there is measured distance x between patterns 1 and 2, or distance y between patterns 3 and 4, in each test pattern 10 formed in the photoresist. In step s2, the coat uniformity of photoresist is evaluated by using the measuring result obtained by performing step s1, namely, the values of distance x between patterns 1 and 2, or distance y between patterns 3 and 4, which are measured at plural locations of the photoresist.

If the photoresist thickness varies within the wafer, the photoresist sensitivity usually varies within the wafer. As described above, when the photoresist sensitivity varies, there occurs the same phenomenon as in the variations in exposure energy. If the main factor affecting the difference between distances x or distances y that are measured at plural locations of the photoresist is variations in photoresist thickness, the distances x or distances y that are measured at plural location of photoresist are of a value corresponding to the variations in the photoresist thickness. It is therefore capable of evaluating the coat uniformity of photoresist by using the values of distance x or distance y obtained in step s1. Needless to say, even when using both of the test patterns 10a and 10b, the coat uniformity of photoresist can be evaluated with the evaluation method of the first preferred embodiment.

An evaluation method of the first preferred embodiment when evaluating the development uniformity of photoresist will next be described. Since the diameter of wafer is usually as much as 200 mm or 300 mm, non-uniformity may occur in the development of photoresist within the wafer. Therefore, it is necessary to evaluate the development uniformity of photoresist. In step s1 of the evaluation method of the first preferred embodiment, for example, a plurality of test patterns 10 are formed in a photoresist over the entire surface of wafer, followed by measurement of distance x between patterns 1 and 2, or distance y between patterns 3 and 4, in each test pattern 10 formed in the photoresist. In step s2, development uniformity of photoresist is evaluated by using the measuring result obtained by performing step s1. Specifically, the following is similar to the case of evaluating the coat uniformity of photoresist. In step s1, by using the photomask 17 shown in FIG. 6, as well as exposure map shown in FIG. 7, the photoresist is subjected to exposure, followed by development, so that the test patterns 10 are formed in the photoresist over the entire surface of wafer. Further in step s1, there is measured distance x between patterns 1 and 2, or distance y between patterns 3 and 4, on each test pattern 10 formed in the photoresist. In step s2, the development uniformity of photoresist is evaluated by using the measuring result obtained by performing step s1, namely, the values of distance x between patterns 1 and 2, or distance y between patterns 3 and 4, which are measured at plural locations of the photoresist.

If non-uniformity in the development of photoresist appears within the wafer, there usually occurs the same phenomenon as in the case of variations in exposure energy, within the wafer. If the main factor affecting the difference between distances x or distances y that are measured at plural locations of the photoresist is the non-uniformity in the development of photoresist, the distances x or distances y that are measured at plural location of photoresist are of a value corresponding to non-uniformity in photoresist development. It is therefore capable of evaluating the development uniformity of photoresist by using the values of distance x or distance y that are measured in step s1. Needless to say, when using both of the test patterns 10a and 10b, the development uniformity of photoresist can be evaluated with the evaluation method of the first preferred embodiment.

Description will next be given of an evaluation method of the first preferred embodiment when evaluating the performance of aligner that is used for performing exposure to photoresist. For example, the aligner performance can be expressed by the following items: lens resolution characteristics, illumination uniformity, and leveling accuracy between wafer and photomask, etc. Further, when a scanning reduction-production aligner called "scanner" is used as aligner, scanning synchronization accuracy is added to the above items. Following is a detail description of these items. When a stepper is used as aligner, exposure is performed chip by chip in the wafer. Due to lens resolution characteristics, focus offset may vary within the chip. That is, within the chip, the location corresponding to the center of lens and the location corresponding to the end of lens have different focus offsets. This might cause variations in focus offset within the chip. There is also the possibility that non-uniformity in illumination appears within the chip. When such non-uniformity occurs, the exposure energy on the photoresist usually varies within the chip. In addition, at the time of exposure, a wafer and photomask are aligned so as to be parallel to each other. It is however difficult to completely hold the wafer and photomask in parallel. As shown in FIG. 8, unless the wafer and photomask is parallel, the exposure energy on the photoresist usually varies within the chip. When a scanner is used as aligner, exposure is performed while a wafer and photomask are moved at the same time. It is therefore necessary to obtain accurate synchronization in movements between the wafer and photomask. However, it is difficult to obtain a perfect synchronization. Unless movements between the wafer and photomask are synchronized, the exposure energy on the photoresist usually varies within the chip.

Since it is necessary to evaluate the aligner performance in semiconductor device manufacture, lens resolution characteristics etc. are evaluated by using the test pattern 10. Specifically, in step s1, by using the photomask 17 shown in FIG. 6, a photoresist is subjected to exposure and development, thereby forming a plurality of test patterns 10 in a region of the photoresist locating above a region that corresponds to a single chip in the wafer. Further in step s1, there is measured distance x between pattern 1 and 2, or distance y between patterns 3 and 4, on each test pattern 10 formed in the photoresist. In step s2, the aligner performance, such as lens resolution characteristics, illumination uniformity, leveling accuracy and scanning synchronization accuracy, are evaluated by using the measuring result obtained by performing step s1, namely, the values of distance x between patterns 1 and 2, or distance y between patterns 3 and 4, which are measured at plural locations of the photoresist.

As described above, focus offset usually varies within the chip due to lens resolution characteristics. Accordingly, if the main factor affecting the difference between distances x or distances y that are measured at plural locations of the photoresist is lens resolution characteristics, the distances x or distances y that are measured at plural location of photoresist are of a value corresponding to lens resolution characteristics. It is therefore capable of evaluating lens resolution characteristics by using the distances x or distances y that are measured in step s1.

When non-uniformity in illumination occurs, the exposure energy on the photoresist varies within the chip. Accordingly, if the main factor affecting the difference between distances x or distances y that are measured at plural locations of the photoresist is non-uniformity in illumination, the distances x or distances y that are measured at plural locations of photoresist are of a value corresponding to illumination uniformity. It is therefore capable of evaluating illumination uniformity by using the distances x or distances y that are measured in step s1.

Unless a wafer and photomask are in parallel, the exposure energy on the photoresist varies within the chip. Accordingly, if the main factor affecting the difference between distances x or distances y that are measured at plural locations of the photoresist is leveling accuracy between the wafer and photomask, the distances x or distances y that are measured at plural locations of photoresist are of a value corresponding to leveling accuracy. It is therefore capable of evaluating the leveling accuracy between the wafer and photomask by using the distances x or distances y that are measured in step s1.

When a scanner is used as aligner and movements between the wafer and photomask is not synchronized, the exposure energy on the photoresist usually varies within the chip. Accordingly, if the main factor affecting the difference between distances x or distances y that are measured at plural locations of the photoresist is the scanning accuracy of scanner, the distances x or distances y that are measured at plural location of photoresist are of a value corresponding to the scanning accuracy. It is therefore capable of evaluating the scanning accuracy of scanner by using the distances x or distances y that are measured in step s1. Even when both of the test patterns 10a and 10b are used, it is of course possible to evaluate the aligner performance with the evaluation method of the first preferred embodiment.

Figure 9:
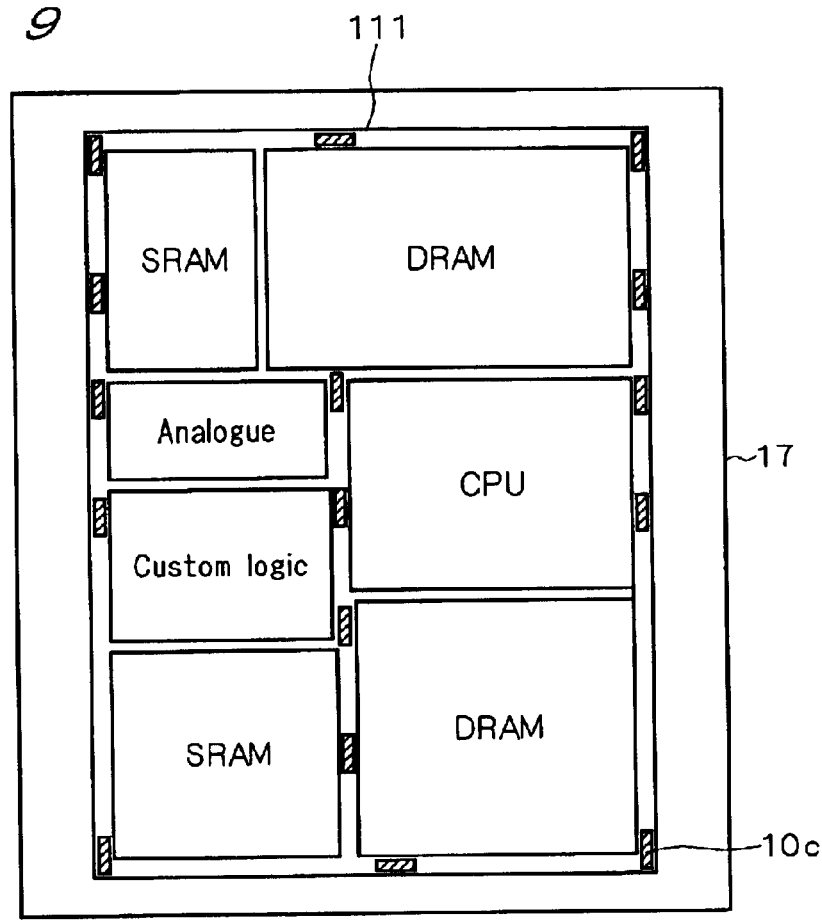
FIG. 9 is a plan view showing a photomask used in the evaluation method of the first preferred embodiment.

Description will next be given of an evaluation method of the first preferred embodiment when evaluating the flatness of the top surface such as of an interlayer insulating film of a semiconductor device. On semiconductor devices such as system LSIs, (large-scale integrated circuits), various functional blocks are disposed within the chip in the wafer. FIG. 9 is a diagram showing a layout of functional blocks within the chip, in which there are disposed SRAM (static random access memory), DRAM, CPU (central processing unit), analog circuit, and custom logic circuit, etc. FIG. 9 also shows a photomask 17 that is used for evaluating the top surface flatness such as of interlayer insulting film of semiconductor device, and a mask pattern 10c that is kept away from the various functional blocks. Referring to FIG. 9, in system LSIs etc., a functional block having a relatively high wiring density, e.g., memory (SRAM, DRAM), and a functional block having a relatively low wiring density, e.g., custom logic circuits, may coexist within the chip. Such a difference in wiring density causes a difference in level on the top surface of interlayer insulating film etc., as stacking of wiring layer is repeated in the manufacturing steps of semiconductor device.

To avoid this, the interlayer insulating film is generally stacked between after forming one wiring layer and before forming the next following wiring layer, and its top surface is planarized by etch back or CMP (chemically mechanical polishing). Even in this planarization process, however, the interlayer insulating film is removed non-uniformly due to a locally high wiring density. Therefore, various devices such as optimization of manufacturing process and dummy pattern disposal are performed. In the semiconductor device manufacture under these circumstances, it is necessary to evaluate the top surface flatness of interlayer insulating film etc. in the same chip.

Further, non-uniformity may occur not only within the chip but also on the top surface of interlayer insulating film within the wafer. This is because the film thickness of interlayer insulating film, as well as the etching rate and polishing rate in CMP to the interlayer insulating film, are non-uniform within the wafer. Particularly, the end portions of wafer are easily affected by non-uniformity, and the top surface of interlayer insulating film is susceptible to a difference in level. Hence it is necessary to evaluate the flatness of the top surface of interlaying insulating film, etc., within the wafer.

Figure 10:
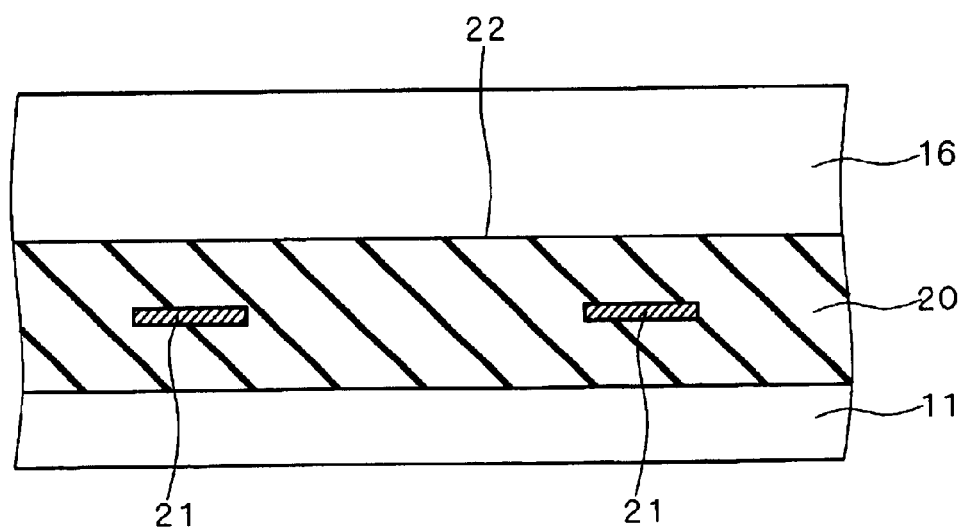
FIG. 10 is a sectional view showing a measuring object used in the evaluation method of the first preferred embodiment.

Referring to FIG. 10, in step s1, a photoresist 16 is formed on an object 20 which is formed on a wafer 11, e.g., the interlayer insulating film, and to which flatness evaluation of top surface 22 is performed (hereinafter referred to as "measuring object 20"). The photoresist 16 formed on the measuring object 20 on the wafer 11 is subjected to exposure and development, thereby forming a plurality of test patterns 10 in the photoresist 16. Then, there is measured distance x between patterns 1 and 2, or distance y between patterns 3 and 4, on each test pattern 10 formed in the photoresist 16. FIG. 10 also shows wiring 21.

The above contents will be further described in the following cases of: evaluating the flatness of the top surface 22 of measuring object 20 in the same chip; and evaluating the flatness of the top surface 22 of measuring object 20 within the wafer. As shown in FIG. 9, a plurality of mask patterns 10c that are used for forming test patterns 10 in a photoresist 16 are formed in a photomask 17 that is used when subjecting the photoresist 16 to exposure. In step s1, by using the photomask 17 shown in FIG. 9, the photoresist 16 is subjected to exposure and development, thereby a plurality of test patterns 10 are formed in a region of the photoresist 16 locating above a region that corresponds to a single chip in the wafer 11. Further in step s1, there is measured distance x between patterns 1 and 2, or distance y between patterns 3 and 4, on each test pattern 10 formed in the photoresist 16. In step s2, the flatness of the top surface 22 of measuring object 20 is evaluated by using the measuring result obtained by performing step s1, namely, the measured values of distance x between patterns 1 and 2, or the values of distance y between patterns 3 and 4, at plural locations of the photoresist 16.

When a difference in level occurs on the top surface 22 of measuring object 20, focus offset usually varies in the same chip. Accordingly, if the main factor affecting the difference between distances x or distances y that are measured at plural locations of the photoresist 16 is a difference in level on the top surface 22 of measuring object 20, the distances x or distances y that are measured at plural location of the photoresist 16 are of a value corresponding to a difference in level on the top surface 22 of measuring object 20. As the result, the flatness of the top surface 22 of measuring object 20 in the same chip can be evaluated by using the distances x or distances y that are measured in step s1.

Following is flatness evaluation of the top surface 22 of measuring object 20 within the wafer. This is similar to the case of evaluating the coat uniformity of photoresist. In step s1, by using the photomask 17 shown in FIG. 6, as well as the exposure map shown in FIG. 7, a photoresist 16 is subjected to exposure, followed by development, thereby a plurality of test patterns 10 are formed in the photoresist 16 over the entire surface of wafer. Further in step s1, there is measured distance x between patterns 1 and 2, or distance y between patterns 3 and 4, on each test pattern 10 formed in the photoresist 16. In step s2, the flatness of top surface 22 of measuring object 20 within the wafer is evaluated by using the measuring result obtained in step s1, namely, the measured values of distance x between patterns 1 and 2, or distance y between patterns 3 and 4, at plural locations of the photoresist 16.

When a difference in level occurs on the top surface 22 of measuring object 20, focus offset usually varies within the wafer. Accordingly, if the main factor affecting the difference between distances x or distances y that are measured at plural locations of the photoresist 16 is a difference in level on the top surface 22 of measuring object 20, the distances x or distances y that are measured at plural locations of the photoresist 16 are of a value corresponding to a difference in level on the top surface 22 of measuring object 20. As the result, the flatness of the top surface 22 of measuring object 20 within the wafer can be evaluated by using the distances x or distances y that are measured in step s1. Even when both of the test patterns 10a and 10b are used, it is of course possible to evaluate the flatness of top surface 22 of measuring object 20 according to the evaluation method of the first preferred embodiment.

Thus, according to the evaluation method of the first preferred embodiment, the above-mentioned evaluation items are evaluated by measuring distance x between a pair of opposed patterns 1 and 2 formed in a photoresist, or distance y between a pair of opposed patterns 3 and 4 formed in the photoresist. This method therefore enables to increase evaluation reliability than the case that evaluation is made by measuring the line width of line pattern or space pattern. That is, it is generally known that the distance between a pair of opposed patterns formed in a photoresist is more liable to change than the line width of the patterns, with respect to exposure energy variations, focus offset variations, or resist sensitivity variations. Referring to FIG. 1, with respect to variations in exposure energy, etc., distance x between a pair of opposed patterns 1 and 2 formed in the photoresist is more liable to change than the line width 1 of the patterns 1 and 2. In the evaluation method of the first preferred embodiment, the evaluation items are evaluated by using physical value that is easy to vary with exposure energy variations, etc. This permits more detail evaluation, thus improving the reliability of evaluation results.

Figure 11A:
FIG. 11 is a diagram showing a test pattern used in the evaluation method of the first preferred embodiment.
Figure 11B:
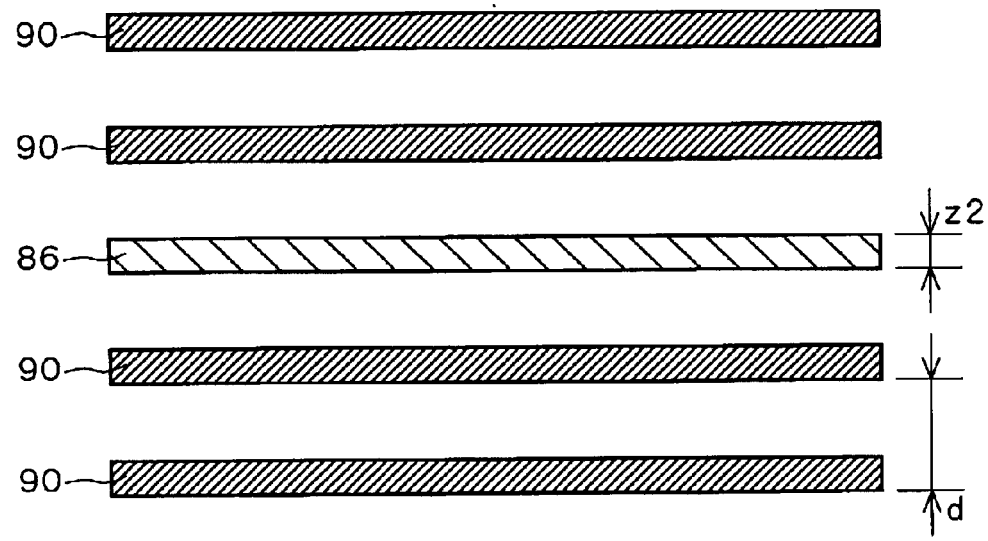

Alternatively, an isolated line pattern 85 as shown in FIG. 11A, or a line pattern 86 sandwiched with dummy patterns 90 by pitch d as shown in FIG. 11B, is formed in a photoresist together with the test pattern 10. Then, line widths z1 and z2 of the line patterns 85 and 86 formed in the photoresist, respectively, are measured and the above-mentioned evaluation items are evaluated by using the measuring results. For instance, line widths z1 and z2 are 150 nm, and pitch d is 450 nm.

Second Preferred Embodiment

FIGS. 12 to 15 are diagrams showing test patterns 60a and 60b used in an evaluation method according to a second preferred embodiment. FIG. 16 is a flowchart showing the evaluation method of the second preferred embodiment. According to this evaluation method, in step s1, the resolution of opposed part 42 defined by patterns 1 and 2 formed in a photoresist or the resolution of opposed part 52 defined by patterns 3 and 4 formed in a photoresist is measured in place of distance x between the patterns 1 and 2 or distance y between the patterns 3 and 4 in the evaluation method of the first preferred embodiment.

Figure 12:
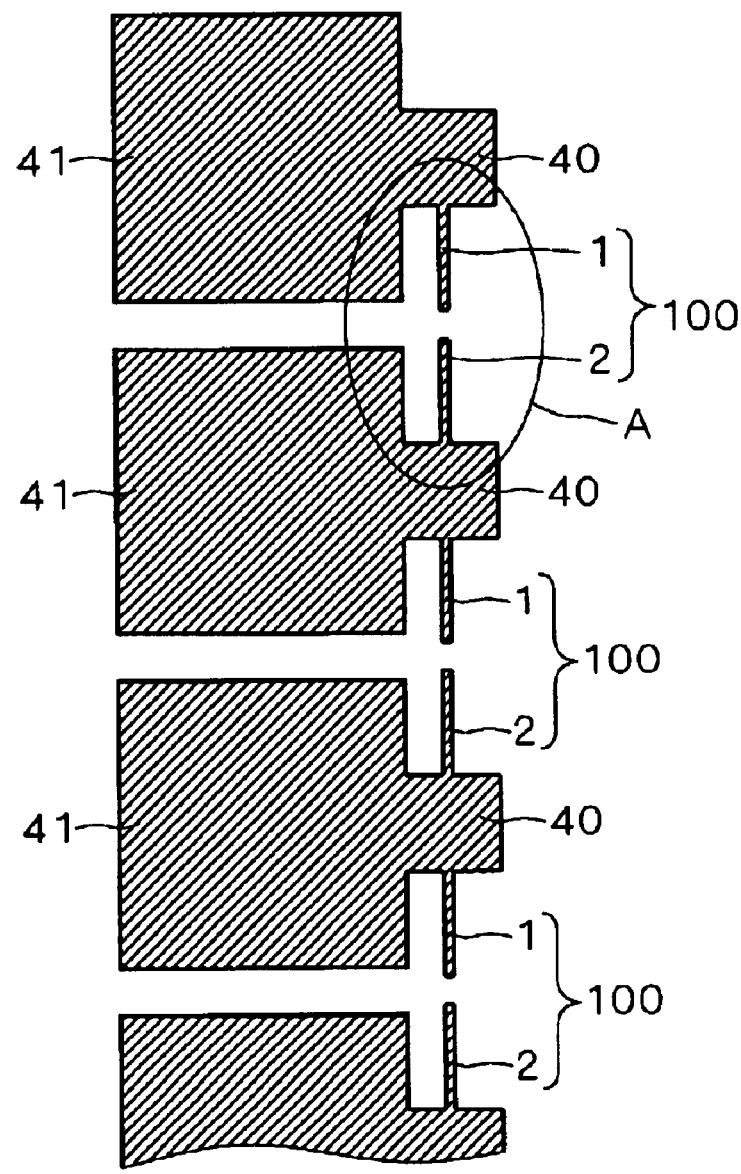
FIGS. 12 and 13 are diagrams showing a test pattern used in an evaluation method according to a second preferred embodiment of the invention.
Figure 13:
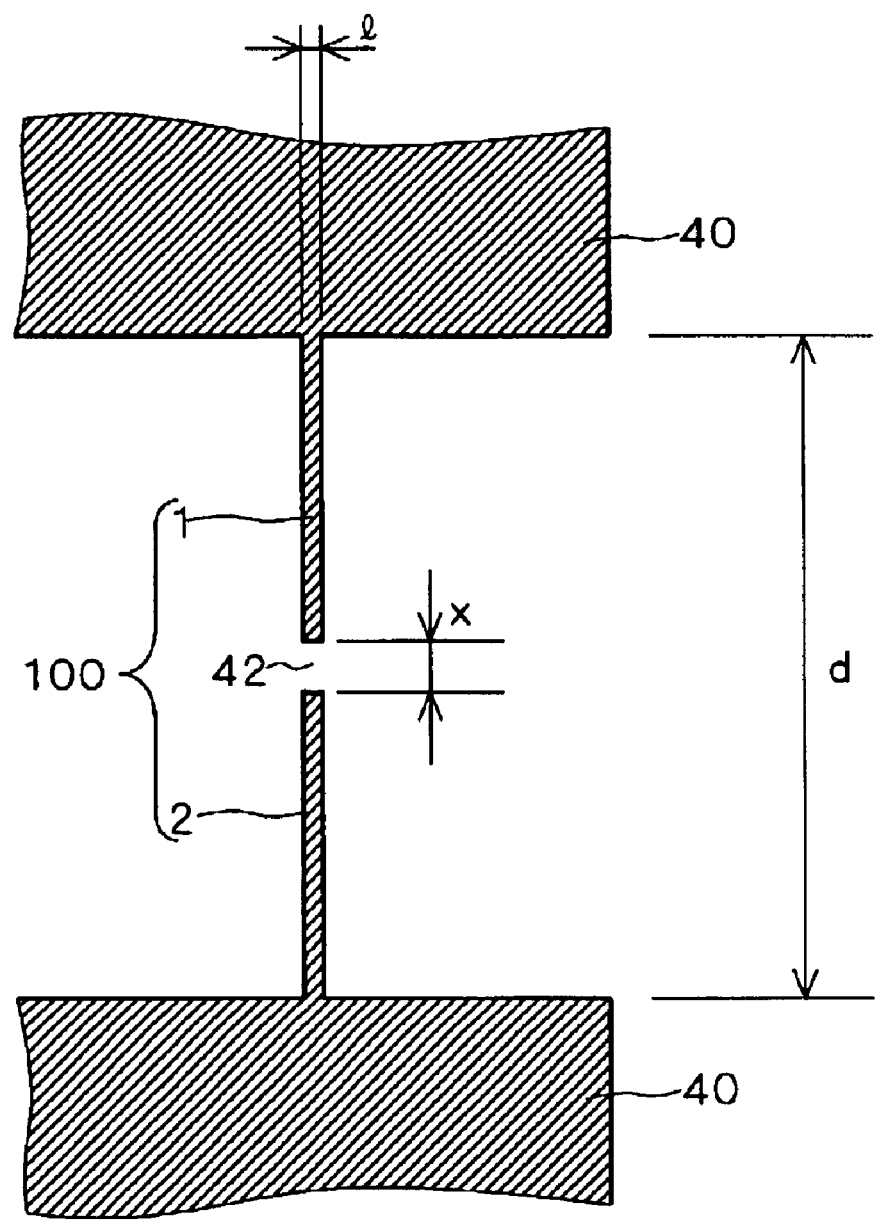

Referring to FIGS. 12 and 13, the test pattern 60a has plural paired line patterns 100, each of which is composed of a pair of patterns 1 and 2 that are isolated line patterns and opposed to each other in distance x. The paired line patterns 100 have different distances x between the patterns 1 and 2. In other words, the test pattern 60a has plural paired patterns 1 and 2, and the plural paired patterns 1 and 2 have different distances x therebetween. Specifically, the test patterns 60 have 15 paired line patterns 100, on which distance x changes at intervals of 5 nm in the range of 120 nm to 190 nm. The test pattern 60a also has plural connection patterns 40 and pad patterns 41. Connection pattern 40 is connected to pad pattern 41. Patterns 1 and 2 are connected to different connection patterns 40. The line width of patterns 1 and 2 is 150 nm, for example. Distance d between one end of the pattern 1 in the direction of the length which is connected to one connection pattern 40, and one end of the pattern 2 in the direction of the length which is connected to another connection pattern 40, is 100 μm, for example. The longitudinal and lateral lengths of connection pattern 40 and pad pattern 41 are as much as several tens μm. This is extremely larger than the line width l of patterns 1 and 2.

Figure 14:
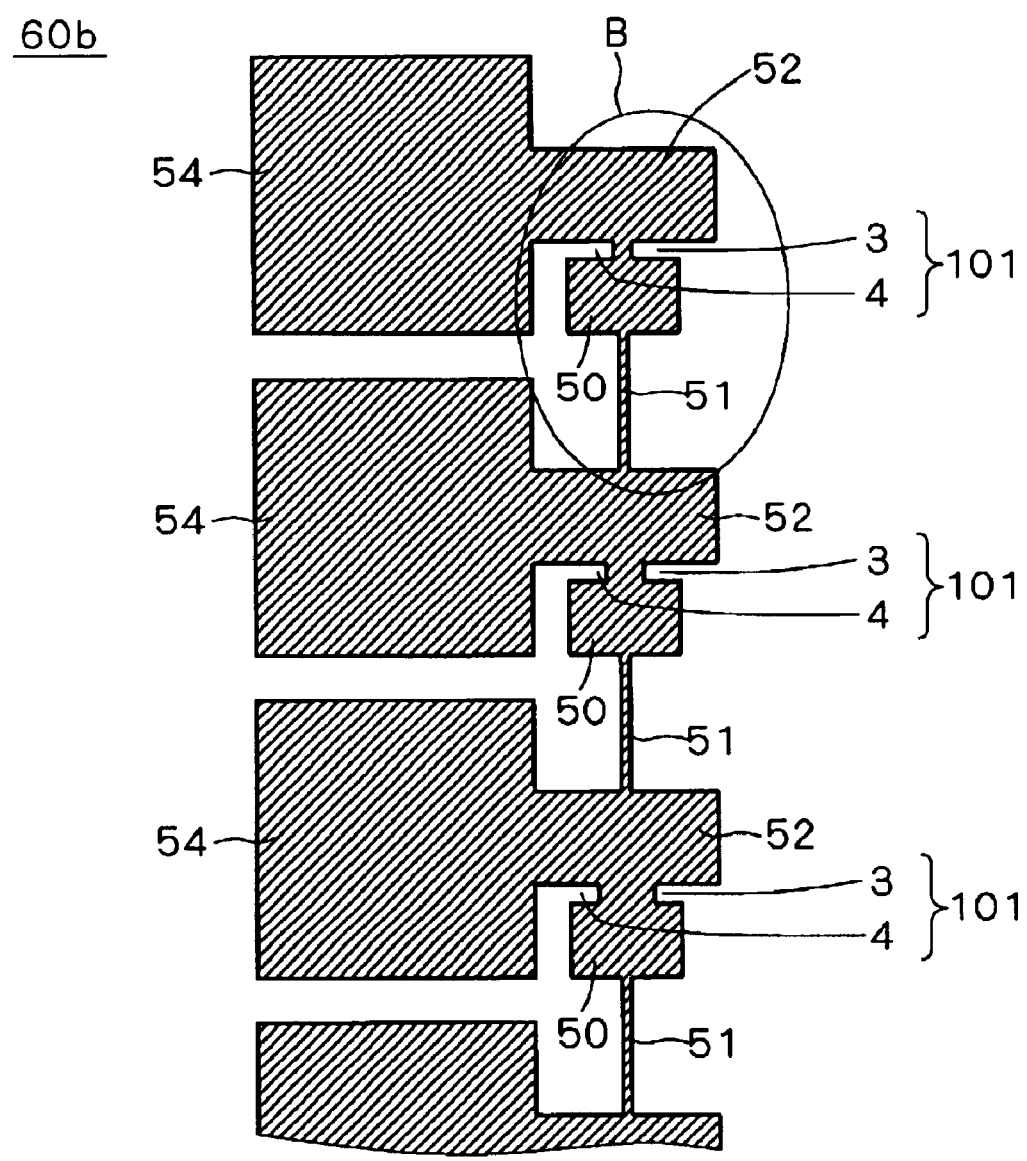
FIGS. 14 and 15 are diagrams showing other test pattern used in the evaluation method of the second preferred embodiment.
Figure 15:
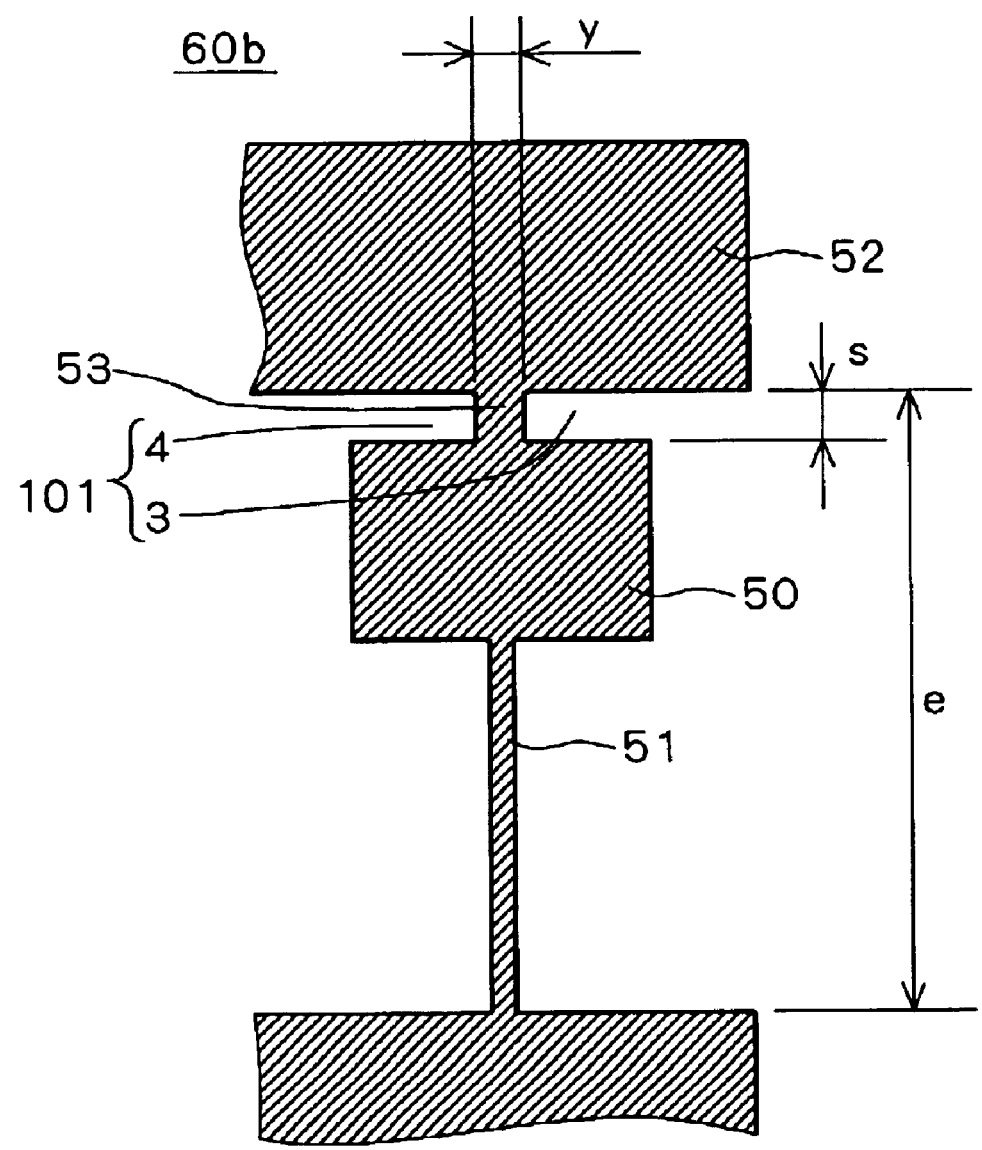
Figure 16:
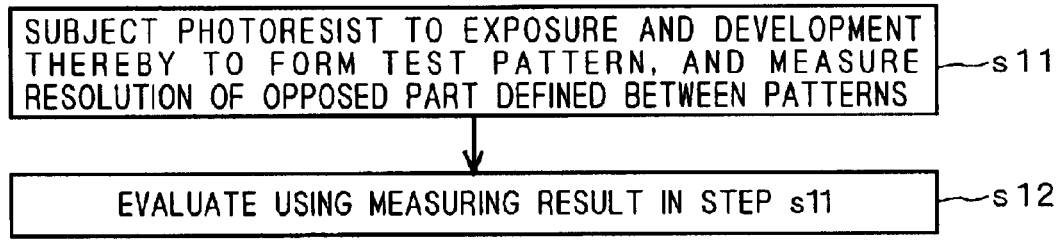
FIG. 16 is a flowchart showing the evaluation method of the second preferred embodiment.

Referring to FIGS. 14 and 15, the test pattern 60b has plural paired space patterns 101, each of which is composed of a pair of patterns 3 and 4 that are isolated space patterns and opposed to each other in distance y. The paired space patterns 101 have different distances y between the patterns 3 and 4. In other words, the test pattern 60b has plural paired patterns 3 and 4, and the plural paired patterns 3 and 4 have different distances y therebetween. Specifically, the test pattern 60b has 15 paired space patterns 101, on which distance y of the paired line pattern 101 changes at intervals of 5 nm in the range of 40 nm to 110 nm. The line width s of patterns 3 and 4 is 260 nm, for example.

The test pattern 60b also has plural pad patterns 54 and plural connection patterns 50, 51, and 52. Pad pattern 54 is connected to connection pattern 52, and the connection pattern 52 is connected to connection pattern 50 via an opposed part 53 of the paired space pattern 101. Connections patterns 50 and 51 are connected to each other. Connection patterns 52, except for ones that are located at opposite ends of the test pattern 60b, are directly connected to connection pattern 51. Distance e between one end of connection pattern 51 in the direction of the length which is directly connected to connection pattern 52 and one end of the patterns 3 and 4 in the direction of the width on the side of connection pattern 52, is 100 μm, for example. The line width of connection pattern 51 is 150 nm, for example. The longitudinal and lateral lengths of pad pattern 54 and connection patterns 50 and 52 are as much as several tens μm. This is extremely larger than the line width s of patterns 3 and 4. The paired space pattern 101 is defined by connection patterns 50 and 52. In the following description, when there is no need to distinguish the test pattern 60a from test pattern 60b, each of the test patterns 60a and 60b is referred to as "test pattern 60." When there is no need to distinguish the paired line patterns 100 from paired space patterns 101, each of the paired line pattern 100 and paired space pattern 101 is referred to as "paired pattern 150."

In an evaluation method of the second preferred embodiment shown in FIG. 16, evaluation related to semiconductor device manufacture is performed by using the above-mentioned test patterns 60a and 60b. An evaluation method of the second preferred embodiment when using the test pattern 60a will be described by referring to FIG. 16. In step s11, a photoresist formed on a wafer is subjected to exposure and development, thereby forming in the photoresist the test pattern 60a having a pair of patterns 1 and 2 that are opposed to each other. Then, the resolution of an opposed part 42 defined between the patterns 1 and 2 is measured. For example, the test patterns 60a and 60b are formed in the photoresist by the method shown in FIG. 4. In step s12, a predetermined evaluation item related to semiconductor device manufacture is evaluated by using the measuring result obtained by performing step s11, namely, the resolution of opposed part 42 between the patterns 1 and 2. Likewise, when using the test pattern 60b, in step s11, the photoresist formed on wafer is subjected to exposure and development, thereby forming in the photoresist the test pattern 60b having a pair of patterns 3 and 4 that are opposed to each other. Then, the resolution of an opposed part 53 defined between the patterns 3 and 4 is measured. In step s12, a predetermined evaluation item is evaluated by using the measuring result obtained by performing step s11, namely, the resolution of opposed part 53 between the patterns 3 and 4. Details of items to be evaluated in step s12 will be described later. Step s11 may be performed plural times depending on the evaluation item.

Following is a method of measuring the resolution of opposed part 42 or opposed part 53, which is performed in step s11 of the evaluation method of the second preferred embodiment. As shown in FIGS. 12 and 13, the test pattern 60a has plural paired line patterns 100 in which distance x between patterns 1 and 2 changes at intervals of 5 nm in the range of 120 nm to 190 nm. When forming the test pattern 60a in a photoresist, the opposed part 42 of the paired line patterns 100 is generally not resolved when distance x is not more than a certain value. Therefore, the resolution of opposed part 42 defined between patterns 1 and 2 can be measured by confirming whether the patterns 1 and 2 of the test pattern 60a formed in the photoresist are in connection, by visual inspection, for example. As previously described, the test pattern 60a has plural paired line patterns 100 having different distances x between patterns 1 and 2. In other words, the test pattern 60a has plural paired patterns 1 and 2 having different distances x between patterns 1 and 2. Hence, the resolution of opposed part 42 can be measured by confirming connection between patterns 1 and 2 formed in the photoresist.

As shown in FIGS. 14 and 15, the test pattern 60b has plural paired space patterns 101 in which distance y between patterns 3 and 4 changes at intervals of 5 nm in the range of 40 nm to 110 nm. In case of forming the test pattern 60b in a photoresist, the opposed part 53 of the paired space patterns 101 is generally not resolved when distance y is not more than a certain value. Therefore, the resolution of opposed part 53 defined between patterns 3 and 4 can be measured by confirming whether the patterns 3 and 4 formed in the photoresist are in connection, by visual inspection, for example. As previously described, the test pattern 60b has plural paired space patterns 101 having different distances y between patterns 3 and 4. In other words, the test pattern 60b has plural paired patterns 3 and 4 having different distances x between patterns 3 and 4. Hence, the resolution of opposed part 53 can be measured by confirming connection between patterns 3 and 4 formed in the photoresist.

FIG. 17 is a diagram showing the results obtained by simulating the resolutions of opposed part 42 and opposed part 53 when exposure energy and focus offset are varied. Referring to FIG. 17, alphabets "Foc." indicate focus offset, and "Exp." indicates exposure energy. For example, there is shown values "0.175–0.055" in $\mu$m, wherein the former value is the resolution of opposed part 42 of the paired line patterns 100, and the latter value is the resolution of opposed part 53 of the paired space patterns 101.

As shown in FIG. 17, the resolution of opposed part 42 defined between patterns 1 and 2 decreases as exposure energy increases, whereas it is almost the same even when focus offset is varied. The resolution of opposed part 53 defined between patterns 3 and 4 increases as exposure energy increases, and the resolution increases approximately as focus offset increases.

Thus, the resolution of opposed part 42 varies as exposure energy varies, as in the variations in distance x between patterns 1 and 2 that are shown in FIG. 5A. Accordingly, items related to variations in exposure energy among the evaluation items of the first preferred embodiment, namely, the amount of variations in exposure energy, stability of photoresist sensitivity, coat uniformity of photoresist, developing uniformity of photoresist, illumination uniformity of aligner, leveling accuracy between photomask and wafer in aligner, and scanning synchronization accuracy in scanner, can be evaluated by using the test pattern 60a in step s12.

On the other hand, the resolution of opposed part 53 varies as exposure energy or focus offset varies, as in the variations in distance y between patterns 3 and 4 that are shown in FIG. 5B. Accordingly, all the evaluation items to be evaluated in the first preferred embodiment can be evaluated by using the test pattern 60b in step s12. Like the evaluation method of the first preferred embodiment, the evaluation method of the second preferred embodiment performs evaluation of every evaluation item by using the resolutions of opposed part 42 and 53 that are easy to change with variations in exposure energy and so on. Therefore, the evaluation reliability is more improved than the case that evaluation is performed by measuring the line widths of line pattern and space pattern.

In the event that in step s11, the resolution of opposed part 42 cannot be measured by the test pattern 60a formed in the photoresist, steps s11 and s12 may be performed by also using another test pattern 60a in which distance x is changed at intervals of 5 nm in such a range that distance x between patterns 1 and 2 is not more than 120 nm or not less than 190 nm. In the event that in step s11, the resolution of opposed part 53 cannot be measured by the test pattern 60b formed in the photoresist, steps s11 and s12 may be performed by also using another test pattern 60b in which distance y changes at intervals of 5 nm in such a range that distance y between patterns 3 and 4 is not more than 40 nm or not less than 115 nm.

Even when both exposure energy and focus offset vary, approximate amounts of variations in exposure energy and focus offset can be obtained in step s11 by performing the evaluation method of the second preferred embodiment by using both test patterns 60a and 60b. Specifically, such data as shown in FIG. 17 is previously taken. Suppose that the resolutions of opposed parts 42 and 53 obtained by performing the first step s11 are respectively "0.175 $\mu$m" and "0.055 $\mu$m." And suppose that the resolutions of opposed parts 42 and 53 obtained by performing the second step s11 are respectively "0.14 $\mu$m" and "0.10 $\mu$m." From FIG. 17, the values of exposure energy and focus offset when the first step s11 is performed are found that exposure energy is 40 mJ/cm$^2$ and focus offset is –0.3 $\mu$m. Further from FIG. 17, the values of exposure energy and focus offset when the second step s11 is performed are found that exposure energy is 48 mJ/cm$^2$ and focus offset is –0.05 to 0 $\mu$m. In this manner, the approximate amounts of variations in exposure energy and focus offset can be obtained even when both exposure, energy and focus offset vary.

In the foregoing, in step s11, the resolutions of opposed parts 42 and 53 are measured by forming the test pattern 60 in the photoresist formed on a wafer, and visually confirming connection between patterns 1 and 2, or between patterns 3 and 4, on the test pattern 60 formed in the photoresist. Following is a method with which the resolutions of opposed parts 42 and 53 are measured electrically not by visual confirmation, in step s11. FIG. 18 is a flowchart showing the method of electrically measuring the resolutions of opposed parts 42 and 53 in step s11. Referring to FIG. 18, in step s21, a photoresist that is formed on a wafer via a conductor film is subjected to exposure and development, thereby to form a test pattern 60. In step s22, the conductor film is then etched by using a photomask as mask. In step s23, the resolution of opposed parts 42 and 53 are measured by confirming conductivity/non-conductivity between patterns 1 and 2 in each of paired line patterns 100, or between patterns 3 and 4 in each of paired space patterns 101, on the test pattern 60 formed in the conductor film. The confirmation of conductivity/non-conductivity between patterns 1 and 2, or between patterns 3 and 4, is performed in the following manner. That is, the electrical resistance between the pad patterns 41 or between the pad patterns 54 is measured by bringing the tester's prober into contact with each of pad patterns 41 adjacent to each other in the test pattern 60a, or each of pad patterns 54 adjacent to each other in the test pattern 60b.

Steps s21 and s22 in FIG. 18 will be described in detail. FIGS. 19A to 19D are sectional views showing a method of forming a test pattern 60 in a conductor film. Referring to FIG. 19A, a silicon oxide film 12 in thickness of 10 nm, a titanium nitride film 13 in thickness of 80 nm, and a tungsten film 14 in thickness of 100 nm are deposited on a wafer 11 in this order named. An organic anti-reflection film 15 is deposited in 80 nm on the tungsten film 14, and a photoresist 16 for KrF excimer laser is formed on the organic anti-reflection film 15. The titanium nitride film 13 and tungsten film 14 form a conductor film 30.

Referring to FIG. 19B, by using a photomask 17 in which a predetermined mask pattern is formed, as well as a stepper of which light source is KrF excimer laser 18, the photoresist 16 is subjected to exposure and development, thereby forming a test pattern 60 in the photoresist 16. The mask pattern formed in the photomask 17 is a mask pattern for forming the test pattern 60 in the photoresist 16. Specifically, when using a stepper of which reduction ratio is 1/5, a pattern having a five-time dimension of the above-mentioned test pattern 60 is drawn on the photomask 17, as mask pattern.

Referring to FIG. 19C, by using the photoresist 16 in which the test pattern 60 is formed, as mask, the organic anti-reflection film 15 and conductor film 30 are selectively removed by dry etching, thereby forming the test pattern 60 in the conductor film 30. The organic anti-reflection film 15 is then removed. When the electrical resistance between patterns 1 and 2 of the test pattern 60 formed in the conductor film 30 is measured on a tester as described above, by the method shown in FIGS. 19A to 19D, the resistance value is about 1400 Ω when the patterns 1 and 2 are in connection, and it is infinity when the both are not in connection.

Thus, in step s11, the resolutions of opposed parts 42 and 53 are measured by confirming the continuity/non-continuity between patterns 1 and 2, or patterns 3 and 4, formed in the conductor film. Therefore, the resolutions of opposed parts 42 and 53 can be measured easily by employing a predetermined measuring instrument, as compared to the case that the resolutions of opposed parts 42 and 53 are measured by visual observation as described above.

When using the above-mentioned test pattern 60, the continuity/non-continuity between patterns 1 and 2 on plural paired line patterns 100, or between patterns 3 and 4 on plural paired space patterns 101, formed in the conductor film, is confirmed per each paired line patterns 100 or each paired space patterns 101. Following is a method with which the continuity/non-continuity between patterns 1 and 2 on the respective paired line patterns 100, or between patterns 3 and 4 on the respective paired space patterns 101, is confirmed at a time.

FIGS. 20 to 23 are diagrams showing test patterns 70a and 70b that are used in the evaluation method of the second preferred embodiment. The test pattern 70a is used for confirming the continuity/non-continuity between patterns 1 and 2 of each paired line patterns 100, and the test pattern 70b is used for confirming the continuity/non-continuity between patterns 3 and 4 of each paired space patterns 101.

Figure 20:
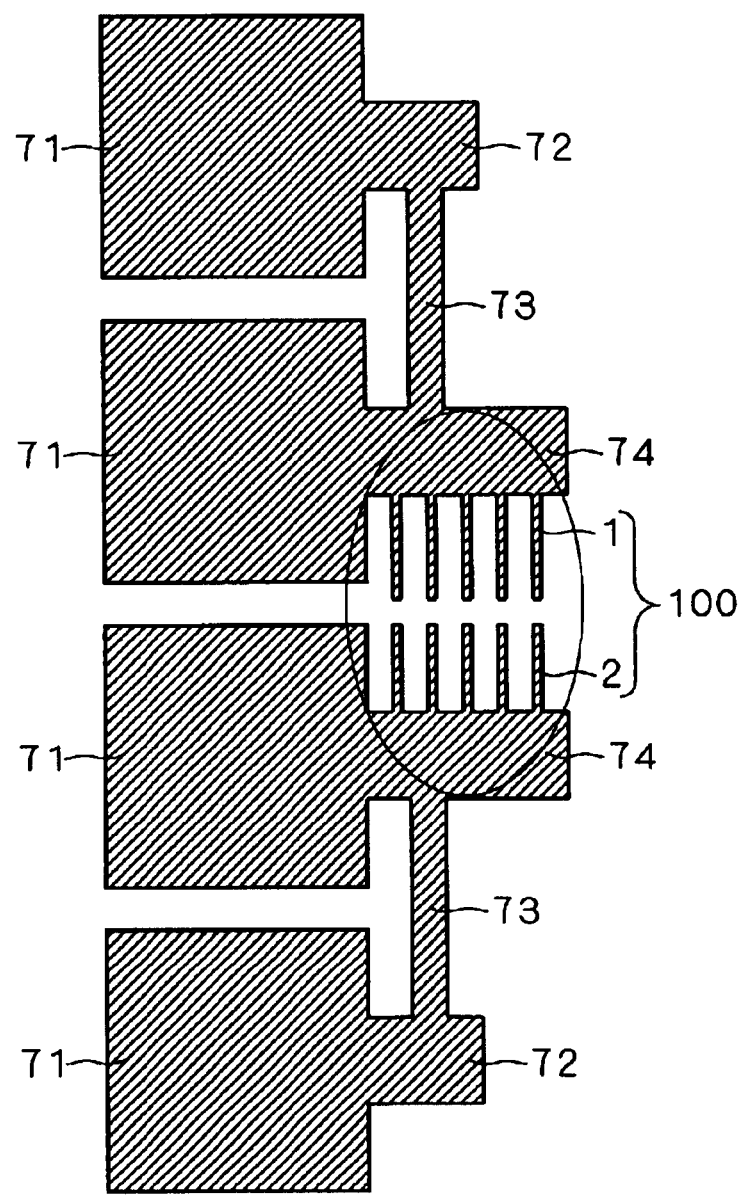

Referring to FIGS. 20 and 21, the test pattern 70a has plural paired line patterns 100 having different distances x between patterns 1 and 2. That is, the test pattern 70a has plural paired patterns 1 and 2, and the plural paired patterns 1 and 2 have different distances x between the patterns 1 and 2. Specifically, the test patterns 70a have five paired line patterns 100 which are disposed at intervals of 850 nm, for example. Distance x of the paired line patterns 100 changes at intervals of 5 nm in the range of 135 nm to 155 nm. The line width l of patterns 1 and 2 is 150 nm, for example. Distance f between one end of pattern 1 in the direction of the length and one end of pattern 2 in the direction of the length, both of which are not opposed to each other, is 100 μm, for example.

The test pattern 70a also has four pad patterns 71, and connection patterns 72, 73, and 74, which are respectively two in number. Of pad patterns 71, ones that are disposed at opposite ends of test pattern 70a are connected to connection pattern 72, and the rest pad patterns 71 are connected to connection pattern 74. Connection pattern 72 is connected to the adjacent connection pattern 74 via connection pattern 73. Patterns 1 and 2 of paired line patterns 100 are respectively connected to different connection patterns 74. The longitudinal and lateral lengths of pad pattern 71 and connection patterns 72 and 74 are as much as several tens μm. This is extremely larger than the line width 1 of patterns 1 and 2. The line width of connection pattern 73 is 10 μm, for example.

Figure 22:
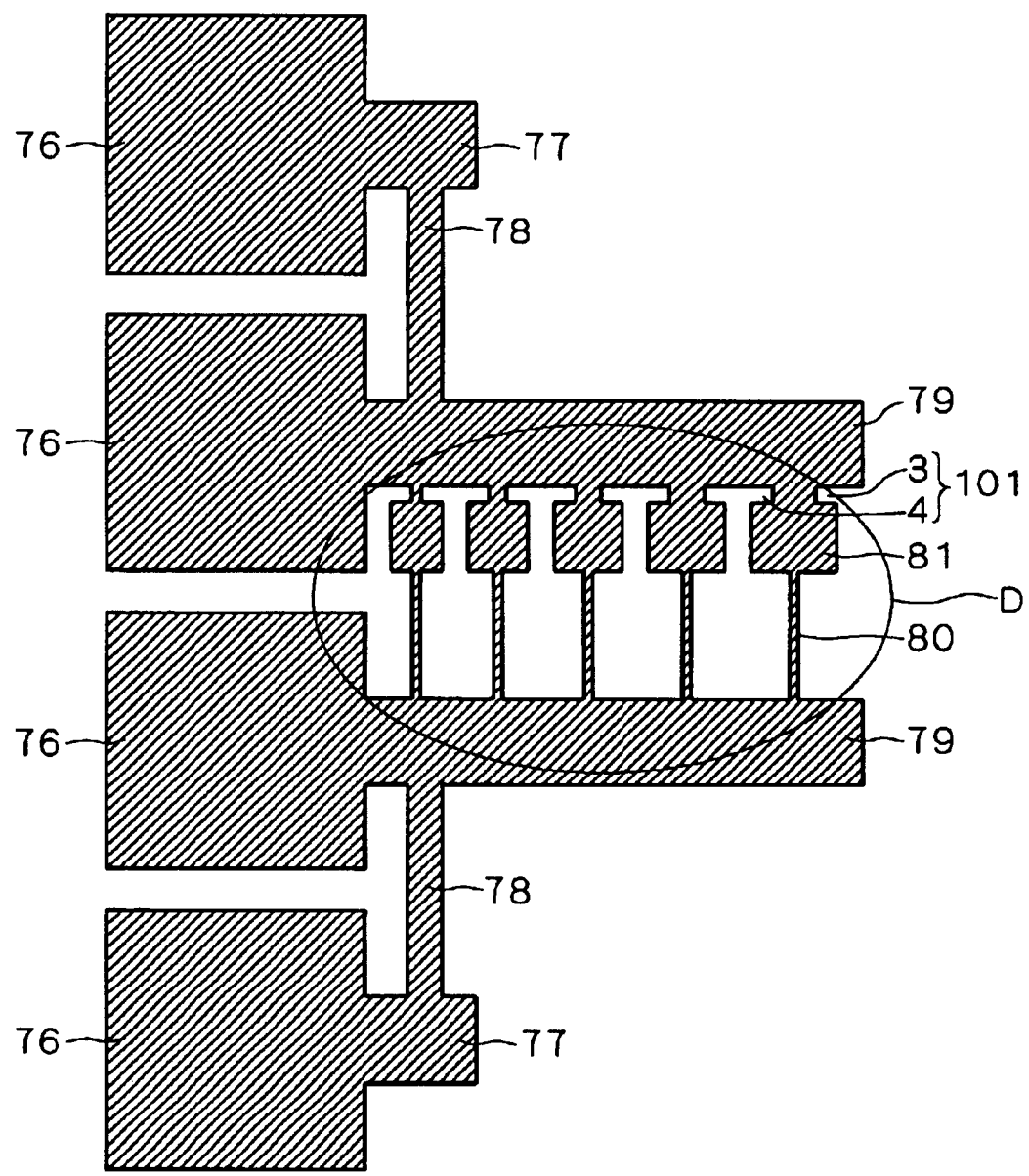
FIGS. 22 and 23 are diagrams showing other test pattern used in the evaluation method of the second preferred embodiment.
Figure 23:
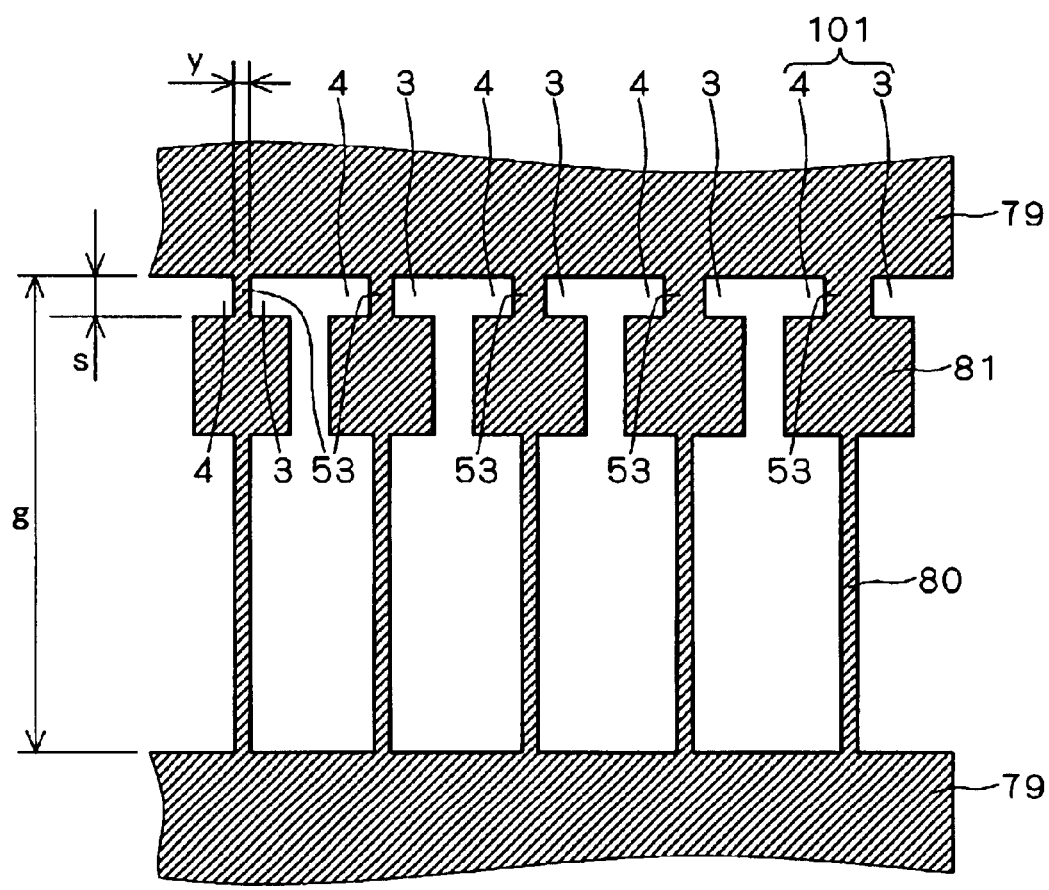

Referring to FIGS. 22 and 23, the test pattern 70b has plural paired space patterns 101 having different distances y between patterns 3 and 4. That is, the paired space patterns 101 have different distances y between the patterns 3 and 4. That is, the test pattern 60b has plural paired patterns 3 and 4, and the plural paired patterns have different distances y. Specifically, the test pattern 70b has five paired space patterns 101, and distance y of the paired space patterns 101 changes at intervals of 5 nm in the range of 55 nm to 75 nm. The line width s of patterns 3 and 4 are 260 nm, for example.

The test pattern 70b also has four pad patterns 76; connection patterns 77, 78, and 79 which are respectively two in number; and connection patterns 80 and 81 which are respectively five in number. Of pad patterns 76, ones that are disposed at opposite ends of test pattern 70b are connected to connection pattern 77, and the rest pad patterns 76 are connected to connection pattern 79. Connection pattern 77 is connected to the adjacent connection pattern 79 via connection pattern 78. Connection patterns 80 and 81 are disposed so as to correspond to paired space patterns 101. Connection pattern 81 is connected to one connection pattern 79 via an opposed part 53 of paired space patterns 101, and this connection pattern 81 is connected to the other connection pattern 79 via connection pattern 80.

Distance g between one end of connection pattern 80 in the direction of the length which is connected to the other connection pattern 79 and one end of patterns 3 and 4 in the direction of the width on the side of connection pattern 79, is 100 µm, for example. The line width of connection pattern 80 is 150 nm, for example. The longitudinal and lateral lengths of pad pattern 76 and connection patterns 77, 78, 79 and 81, are as much as several tens µm. This is extremely larger than the line width 1 of patterns 3 and 4. In the following description, when there is no need to distinguish the test pattern 70a from test pattern 70b, each of the test patterns 70a and 70b is referred to as "test pattern 70." On the test pattern 70a, the pad patterns 71 that are connected to each other via connection pattern 73 are hereinafter referred to as "paired pad pattern 71." On the test pattern 70b, the pad patterns 76 that are connected to each other via connection pattern 78 are hereinafter referred to as "paired pad pattern 76."

Description will next be given of a method of measuring the resolution of opposed parts 42 and 53, when the above-mentioned test pattern 70 is used in the evaluation method of the second preferred embodiment.

Figure 24:
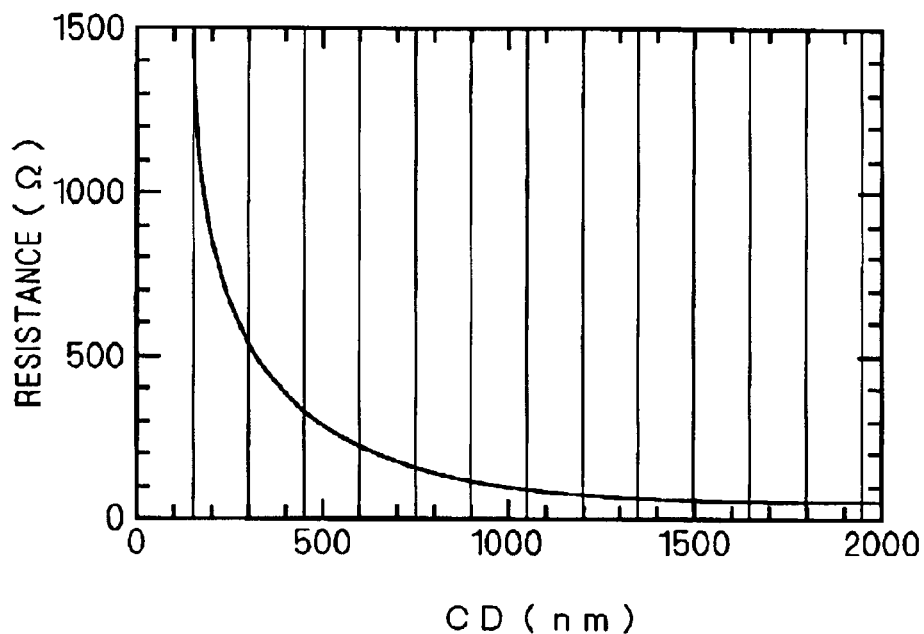
FIG. 24 is a diagram showing the relationship between the line width of conductor film and electrical resistance in the second preferred embodiment.

In step s11 in the second preferred embodiment, a test pattern 70a is formed in a conductor film by the method as shown in FIG. 19, for example. The tester's prober is brought into contact with each of the paired pad patterns 71 formed in the conductor film, thereby measuring the electrical resistance between the paired pad patterns 71. Before measuring the electrical resistance, the electrical resistance at both ends of the conductor film in the direction of the length is previously measured while changing the line width of conductor film that has the same wiring length as distance f of the test pattern 70a. FIG. 24 is a diagram showing the results that are obtained by measuring the electrical resistance at both ends of the conductor film 30 in the direction of the length, when in the conductor film 30 shown in FIG. 19, the line width of conductor film 30 having a wiring length of 100 µm is changed in the range of 150 nm to 2000 nm. Alphabets "CD" of the horizontal axis in FIG. 24 indicates line width. As shown in FIG. 24, needless to say, the electrical resistance of conductor film 30 decreases as line width increases.

The electrical resistance between the paired pad patterns 71 thus measured varies depending on the number of contacts between patterns 1 and 2 in the five paired line patterns 100, in other words, the number of resolved opposed parts 42 between patterns 1 and 2. For instance, if all the opposed parts 42 in all the paired line patterns 101 are resolved, there is no connection between the paired pad patterns 71, and the resistance therebetween indicates infinite. For instance, if the number of paired line patterns 100 where the opposed part 42 is resolved is three, the number of paired line patterns 100 where the opposed part 42 is not resolved is two. It follows that connection between paired pad patterns 71 is made by wiring of 300 nm (150 nm×2) in line width and 100 µm in wiring length. The electrical resistance between paired pad patterns 71 measured at that time indicates about 500 Ω, as shown in FIG. 24. Accordingly, the number of resolved opposed parts 42 can be confirmed by the data shown in FIG. 24 that are previously taken, and the measured electrical resistance between paired pad patterns 71.

Figure 25:
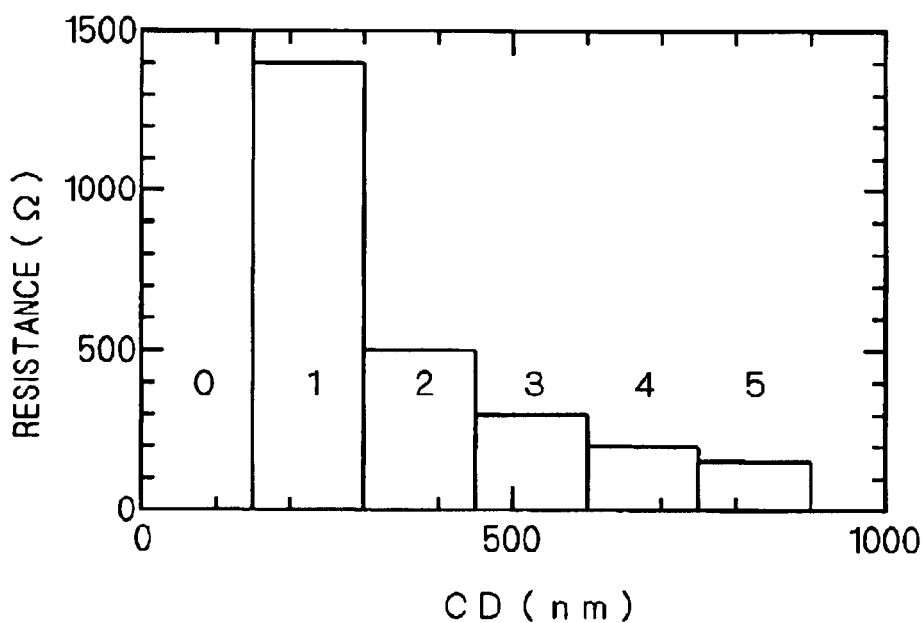
FIG. 25 is a diagram showing the relationship between the number of patterns having undeveloped opposed part and the electrical resistance between patterns.

In addition, previously taking the data shown in FIG. 25 enables digital judgment of the number of paired line patterns 100 where the opposed part 42 is not resolved, namely, where patterns 1 and 2 are in contact, based on the measured electrical resistance. FIG. 25 is a diagram showing the relationship between the electrical resistances between paired pad patterns 71 that are measured in step s11, and the number of paired line patterns 100 where the opposed part 42 is not resolved. Alphabets "CD" of the horizontal axis in FIG. 25 indicates the total of line widths 1 of paired line patterns 100 where the opposed part 42 is not resolved. FIGS. "0 to 5" in FIG. 25 indicates the number of paired line patterns 100 where the opposed part 42, is not resolved, namely, where patterns 1 and 2 are in contact.

As stated above, the electrical resistance between paired pad patterns 71 of test pattern 70a formed in the conductor film is measured, and the number of paired line patterns 100 where the opposed part 42 is resolved is confirmed. From the obtained number, the continuity/non-continuity between patterns 1 and 2 of all the paired line patterns 100 can be confirmed at a time, because the paired line patterns 100 have different distances x between patterns 1 and 2. Likewise, when using the test pattern 70b, the continuity/non-continuity between patterns 3 and 4 of all the paired space patterns 101 can be confirmed at a time by measuring the electrical resistance between paired pad patterns 76 in step s11.

In the event that in step s11, the number of paired line patterns 100 where the opposed part 42 is resolved cannot be confirmed by the test pattern 70a formed in the conductor film, step s11 may be performed by also using another test pattern 70a on which distance x between patterns 1 and 2 is changed at intervals of 5 nm in such a range that distance x is not more than 135 nm or not less than 155 nm. In the event that in step s11, the number of paired line patterns 100 where the opposed part 42 is resolved cannot be confirmed by the test pattern 70b formed in the conductor film, step s11 may be performed by also using another test pattern 70b on which distance y between patterns 3 and 4 is changed at intervals of 5 nm in such a range that distance x is not more than 55 nm or not less than 75 nm.

In this manner, the continuity/non-continuity between patterns 1 and 2 of all the paired line patterns 100, or the continuity/non-continuity between patterns 3 and 4 of all paired space patterns 101, is confirmed at a time in step s11. As the result, the resolution of opposed part 42 can be measured in a shorter time than the case of confirming the continuity-non-continuity between patterns 1 and 2 per each paired line patterns 100. Also, a single pad pattern 71 for continuity inspection can be used in plural paired line patterns 100, because the continuity/non-continuity between patterns 1 and 2 of all the paired line patterns 100 is confirmed at a time in step s11. It is therefore capable of reducing the area of test pattern 70a than the test pattern 60a. Needless to say, the same effects are obtainable with the use of the test pattern 70b or both of the test patterns 70a and 70b.

Although the evaluation method of the second preferred embodiment uses the test pattern 60 or 70, it may be performed in the following manner. Specifically, an isolated line pattern 85 as shown in FIG. 11A, or a line pattern 86 that is sandwiched with dummy patterns 90 by pitch d as shown in FIG. 11B, is formed in a photoresist together with the test pattern 60 or 70. Then, line width z1 of line pattern 85, or line width z2 of line pattern 86, each of which is formed in the photoresist, is measured and the above-mentioned evaluation items are evaluated by using the measuring results.

Although the test pattern 70 has five paired patterns 150, it may have more than five paired patterns 150.

Although in the test patterns 70a and 70b, distance x and distance y are changed at intervals of 5 nm, narrower intervals permits more accurate measurement of resolution of opposed parts 42 and 53. It is preferable that distances x and y be changed at intervals of 2 nm or 1 nm.

Third Preferred Embodiment

Figure 26:
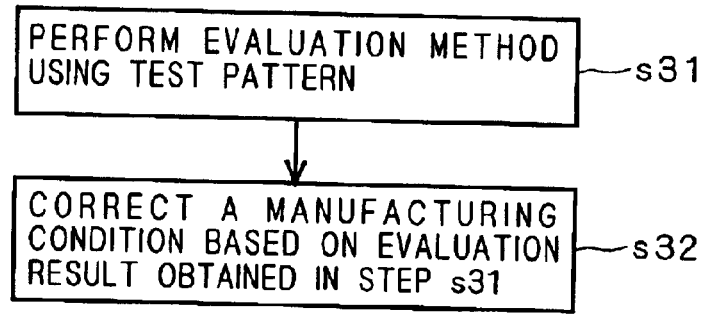
FIGS. 26 and 27 are flowcharts showing a method of correcting a manufacturing condition according to a third preferred embodiment of the invention.

FIG. 26 is a flowchart showing a method of correcting a manufacturing condition according to a third preferred embodiment. Referring to FIG. 26, this method performs, in step s31, the evaluation method of the first preferring embodiment using the test pattern 10, or the evaluation method of the second preferred embodiment using the test pattern 60 or 70. In step s32, the manufacturing condition of a semiconductor device is corrected based on the evaluation result obtained in step s31. As example, a method of correcting the manufacturing condition according to the third preferred embodiment when evaluating the coat uniformity of photoresist by the evaluation method of the first preferred embodiment will be described by referring to FIG. 27.

Figure 27:
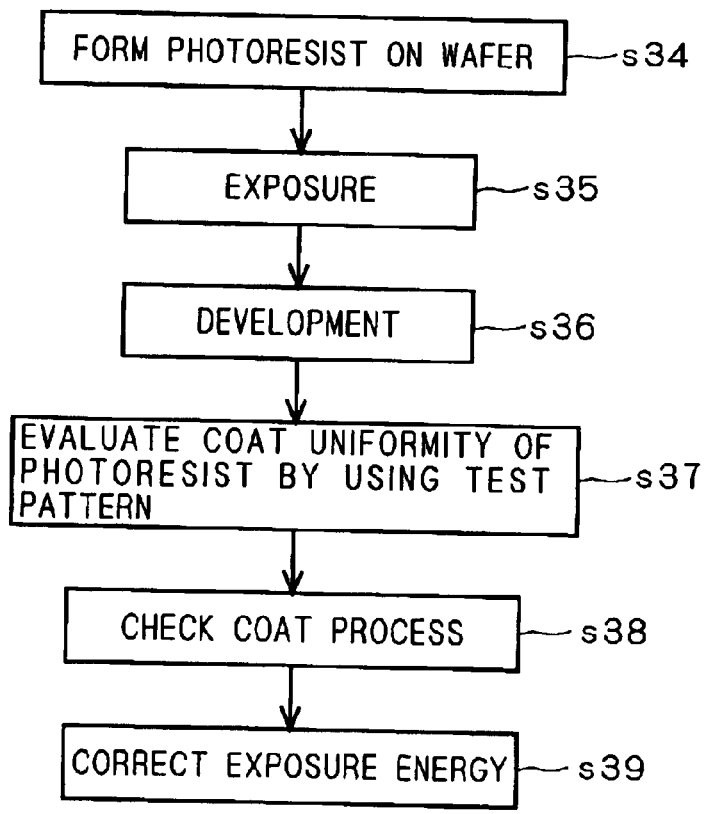

As shown in FIG. 27, in step s34, a photoresist is formed on a wafer. In step s35, the photoresist is subjected to exposure. In step s36, the photoresist is developed, thereby to form plural test patterns 10a in the photoresist. In step s37, by using these test patterns 10a, namely, by measuring distance x between patterns 1 and 2 of each test pattern 10a, the coat uniformity of photoresist is evaluated by using the measuring results. As the result, if recognized abnormality in coat uniformity, coating process is firstly checked in step s38. As the result, if occurred non-uniformity in wafer temperature, for example, the wafer temperature is made uniform by adjusting the bowl temperature in the coater of photoresist, or adjusting the location of hot plate that applies heat while supporting the wafer. If there is further need of adjusting exposure energy, exposure energy to a specific shot is adjusted in step s39.

As described above, according to the method of correcting the manufacturing condition in the third preferred embodiment, the semiconductor device manufacturing condition is corrected based on the evaluation results obtained by performing the evaluation method according to the first or second preferred embodiment. The semiconductor device manufacturing condition can be corrected properly because of high reliability in evaluation results obtained by performing the evaluation method of the first or second preferred embodiment, as previously described.

Fourth Preferred Embodiment

Figure 28:
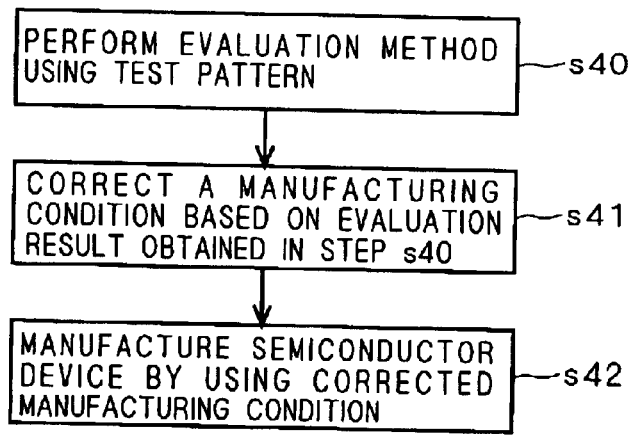
FIGS. 28 and 29 are flowcharts showing a method of manufacturing a semiconductor device according to a fourth preferred embodiment.

FIG. 28 is a flowchart showing a method of manufacturing a semiconductor device according to a fourth preferred embodiment. Referring to FIG. 28, this method performs, in step s40, the evaluation method of the first preferring embodiment using the test pattern 10, or the evaluation method of the second preferred embodiment using the test pattern 60 or 70. In step s41, semiconductor device manufacturing condition is corrected based on the evaluation result obtained in step s40. In step s42, a predetermined semiconductor device is manufactured under the corrected manufacturing condition obtained in step s41. As example, a method of manufacturing a semiconductor device in the fourth preferred embodiment when the amount of variations in exposure energy is evaluated by the evaluation method of the first preferred embodiment will be described by referring to FIG. 29.

Figure 29:
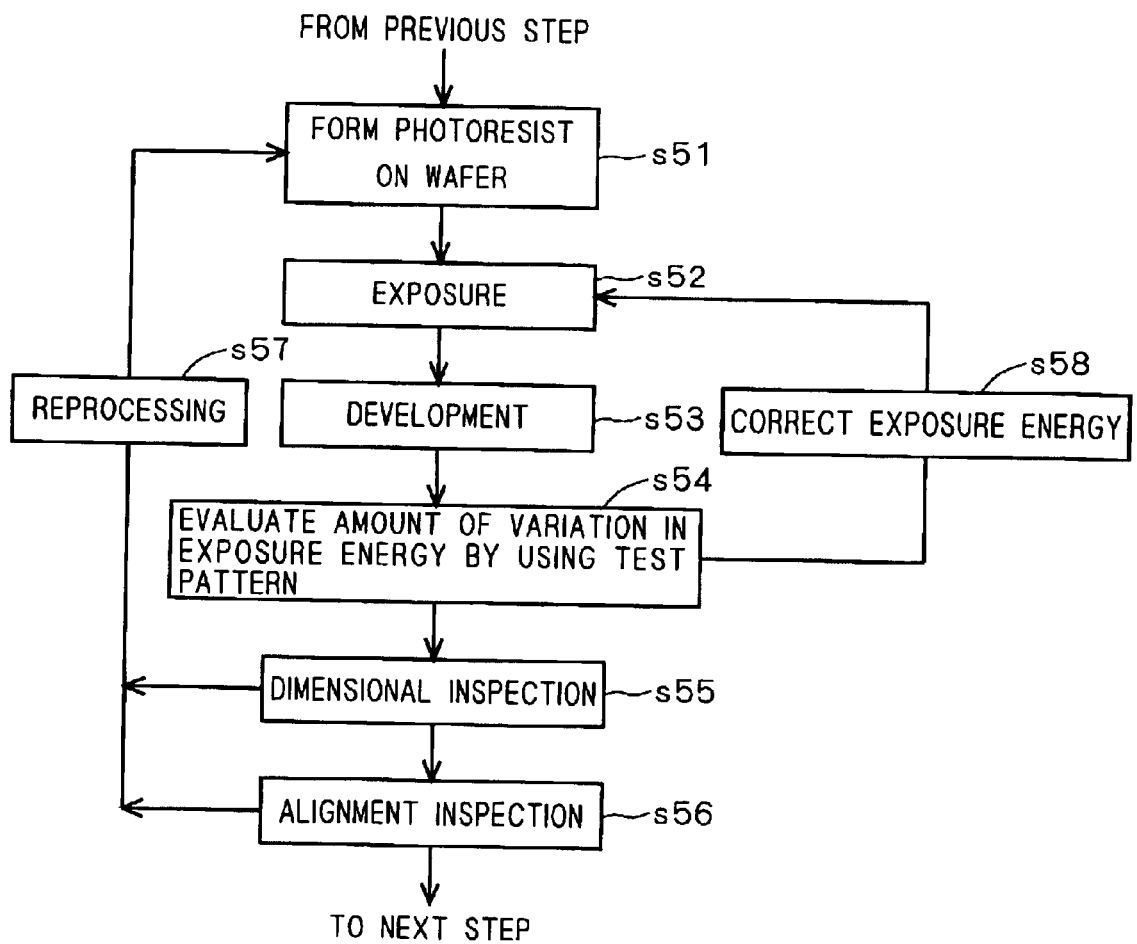

FIG. 29 is a flowchart when the evaluation method of the first preferred embodiment is performed in manufacturing steps of a predetermined semiconductor device. That is, the evaluation method of the first preferred embodiment is performed in addition to dimensional inspection and alignment inspection that are usually performed to the developed photoresist.

Referring to FIG. 29, in step s51, a photoresist is formed on a wafer of semiconductor device that is fed from the previous step. In step s52, the photoresist is subjected to exposure. In step s53, the photoresist is subjected to development, and a predetermined circuit pattern and a test pattern 10a are formed in the photoresist at a time. In step s54, by using the test pattern 10a formed in the photoresist, namely, by measuring distance x between patterns 1 and 2 of the test pattern 10a, the amount of variations in exposure energy is evaluated by using the measuring result. The value of exposure energy that is used as reference for evaluating the amount of variations in exposure energy is to be previously obtained by performing steps s1 and s2. As the result of evaluation, if exposure energy correction is needed, for example, exposure energy is corrected in step s58. Then, when manufacturing the next following manufacturing lot, a photoresist is subjected to exposure at the corrected exposure energy. After the step s54, in step s55, dimensional inspection is performed. In step s56, alignment inspection is performed. Depending on the results of dimensional inspection and alignment inspection, reprocessing is performed in step s57.

As described above, according to the method of correcting manufacturing conditions in the fourth preferred embodiment, the semiconductor device is manufactured under the semiconductor device manufacturing condition that is corrected based on the evaluation results obtained by performing the evaluation method according to the first or second preferred embodiment. Since the semiconductor device manufacturing condition so corrected is proper, the semiconductor device manufacture under this condition can improve yield in its manufacturing steps, for example.

While the invention has been shown and described in detail, the foregoing description is in all aspects illustrative and not restrictive. It is therefore understood that numerous modifications and variations can be devised without departing from the scope of the invention.

What is claimed is:

1. An evaluation method comprising the steps of:

(a) subjecting a photoresist formed on a wafer to exposure and development thereby to form in said photoresist a test pattern having at least one pair of line patterns, each of said line patterns extending in one direction and an end portion of each said line pattern being opposed to each other in the one direction, and measuring the distance between said line patterns formed in said photoresist; and (b) evaluating a predetermined item related to semiconductor device manufacture by using measuring results obtained by performing said step (a).

2. The evaluation method according to claim 1, wherein said step (a) is repeated plural times; and in said step (b), age-based amount of variations in exposure energy is evaluated.

3. The evaluation method according to claim 1, wherein said step (a) is repeated plural times; and in said step (b), age-based amount of variations in focus offset is evaluated.

4. The evaluation method according to claim 1, wherein in said step (a), plural said test patterns are formed in said photoresist, and distance between said line patterns on each of said plural test patterns is measured; and in said step (b), performance of aligner used in said exposure to said photoresist is evaluated.

5. The evaluation method according to claim 4, wherein in said step (b), resolution characteristics of lens of said aligner is evaluated by using said measuring results.

6. The evaluation method according to claim 4, wherein in said step (b), leveling accuracy between a photomask and said wafer in said aligner is evaluated by using said measuring results.

7. The evaluation method according to claim 4, wherein in said step (b), illumination uniformity in said aligner is evaluated by using said measuring results.

8. The evaluation method according to claim 4, wherein said aligner is a scanner, and
in said step (b), scanning synchronization accuracy in said scanner is evaluated by using said measuring results.

9. An evaluation method comprising the steps of:
(a) subjecting a photoresist formed on a wafer to exposure and development thereby to form in said photoresist a test pattern having at least one pair of space patterns, each of said space patterns extending in one direction and an end portion of each said space pattern being opposed to each other in the one direction, and measuring the distance between said space patterns formed in said photoresist; and
(b) evaluating a predetermined item related to semiconductor device manufacture by using measuring results obtained by performing said step (a).

10. The evaluation method according to claim 9, wherein said step (a) is repeated plural times; and
in said step (b), age-based amount of variations in exposure energy is evaluated.

11. The evaluation method according to claim 9, wherein said step (a) is repeated plural times; and
in said step (b), age-based amount of variations in focus offset is evaluated.

12. The evaluation method according to claim 9, wherein
in said step (a), plural said test patterns are formed in said photoresist, and distance between said space patterns on each of said plural test patterns is measured; and
in said step (b), performance of aligner used in said exposure to said photoresist is evaluated.

13. The evaluation method according to claim 12, wherein in said step (b), resolution characteristics of lens of said aligner is evaluated by using said measuring results.

14. The evaluation method according to claim 13, wherein in said step (b), leveling accuracy between a photomask and said wafer in said aligner is evaluated by using said measuring results.

15. The evaluation method according to claim 12, wherein in said step (b), illumination uniformity in said aligner is evaluated by using said measuring results.

16. The evaluation method according to claim 12, wherein said aligner is a scanner, and
in said step (b), scanning synchronization accuracy in said scanner is evaluated by using said measuring results.

* * * * *